United States Patent
Nakai et al.

(10) Patent No.: US 12,028,051 B2
(45) Date of Patent: Jul. 2, 2024

(54) MULTIPLEXER, HIGH-FREQUENCY FRONT-END CIRCUIT, AND COMMUNICATION DEVICE

(71) Applicant: Murata Manufacturing Co., Ltd., Nagaokakyo (JP)

(72) Inventors: Yasuharu Nakai, Nagaokakyo (JP); Katsuya Daimon, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 247 days.

(21) Appl. No.: 17/241,126

(22) Filed: Apr. 27, 2021

(65) Prior Publication Data

US 2021/0250015 A1 Aug. 12, 2021

Related U.S. Application Data

(62) Division of application No. 16/199,279, filed on Nov. 26, 2018, now Pat. No. 11,025,227.

(30) Foreign Application Priority Data

Dec. 12, 2017 (JP) ................................. 2017-237808

(51) Int. Cl.
*H03H 9/64* (2006.01)
*H03F 3/195* (2006.01)
(Continued)

(52) U.S. Cl.
CPC .......... *H03H 9/6489* (2013.01); *H03F 3/195* (2013.01); *H03F 3/245* (2013.01); *H03F 3/72* (2013.01);
(Continued)

(58) Field of Classification Search
CPC ...... H03H 9/145–9/14597; H03H 9/25; H03H 9/64–9/6496; H03H 9/72–9/725
See application file for complete search history.

(56) References Cited

U.S. PATENT DOCUMENTS 5,831,493 A * 11/1998 Ushiroku ............. H03H 9/6483
333/195
7,741,931 B2 * 6/2010 Matsuda ............... H03H 9/0222
333/195

(Continued)

FOREIGN PATENT DOCUMENTS

JP 02295211 A * 12/1990

OTHER PUBLICATIONS

Nakai et al., "Multiplexer, High-Frequency Front-End Circuit, and Communication Device", U.S. Appl. No. 16/199,279, filed Nov. 26, 2018.

*Primary Examiner* — Gennadiy Tsvey
(74) *Attorney, Agent, or Firm* — Keating & Bennett, LLP

(57) ABSTRACT

A first filter of a multiplexer includes serial resonators and parallel resonators that are acoustic wave resonators. A first of the serial resonators that is closer to a common terminal than the other serial resonators is connected to the common terminal without the parallel resonators interposed therebetween. Each of the elastic wave resonators includes a substrate having piezoelectricity, an IDT electrode provided on the substrate, and a dielectric layer provided on the substrate to cover the IDT electrode. A thickness of the dielectric layer of the first serial resonator is smaller than a thickness of each of the dielectric layers of the remainder of the elastic wave resonators.

8 Claims, 13 Drawing Sheets

(51) Int. Cl.
  *H03F 3/24* (2006.01)
  *H03F 3/72* (2006.01)
  *H03H 9/02* (2006.01)
  *H03H 9/145* (2006.01)
  *H03H 9/25* (2006.01)
  *H03H 9/72* (2006.01)
  *H04B 1/00* (2006.01)
  *H04B 1/40* (2015.01)
  *H03F 3/19* (2006.01)
  *H03F 3/21* (2006.01)

(52) U.S. Cl.
  CPC .... *H03H 9/02559* (2013.01); *H03H 9/02637* (2013.01); *H03H 9/02937* (2013.01); *H03H 9/145* (2013.01); *H03H 9/25* (2013.01); *H03H 9/6483* (2013.01); *H03H 9/6496* (2013.01); *H03H 9/725* (2013.01); *H04B 1/0057* (2013.01); *H04B 1/40* (2013.01); *H03F 3/19* (2013.01); *H03F 3/21* (2013.01); *H03F 2200/111* (2013.01); *H03F 2200/165* (2013.01); *H03F 2200/171* (2013.01); *H03F 2200/294* (2013.01); *H03F 2200/451* (2013.01); *H03F 2203/7209* (2013.01); *H03H 9/02834* (2013.01)

(56) References Cited

U.S. PATENT DOCUMENTS

| | | | | |
|---|---|---|---|---|
| 8,294,330 | B1* | 10/2012 | Abbott | H03H 9/02834 |
| | | | | 310/365 |
| 10,158,341 | B2* | 12/2018 | Nosaka | H03H 9/6483 |
| 10,250,220 | B2* | 4/2019 | Miwa | H03H 9/1064 |
| 10,250,226 | B2* | 4/2019 | Saji | H10N 30/877 |
| 10,284,176 | B1* | 5/2019 | Solal | B06B 1/0622 |
| 2006/0139120 | A1* | 6/2006 | Yamaguchi | H03H 9/6483 |
| | | | | 333/133 |
| 2007/0152774 | A1* | 7/2007 | Nakanishi | H03H 3/02 |
| | | | | 333/195 |
| 2009/0236935 | A1* | 9/2009 | Kando | H03H 9/02055 |
| | | | | 310/313 R |
| 2010/0219905 | A1* | 9/2010 | Nakamura | H03H 9/02881 |
| | | | | 333/195 |
| 2010/0302976 | A1* | 12/2010 | Tikka | H04B 1/406 |
| | | | | 370/278 |
| 2011/0215884 | A1* | 9/2011 | Fujiwara | H03H 9/6483 |
| | | | | 333/195 |
| 2012/0019101 | A1* | 1/2012 | Nakahashi | H03H 9/02559 |
| | | | | 310/313 C |
| 2012/0044027 | A1* | 2/2012 | Nakanishi | H03H 9/14526 |
| | | | | 333/133 |
| 2012/0086521 | A1* | 4/2012 | Tsurunari | H03H 9/02834 |
| | | | | 333/195 |
| 2012/0133246 | A1* | 5/2012 | Yaoi | H03H 9/131 |
| | | | | 310/313 C |
| 2013/0162368 | A1* | 6/2013 | Tsurunari | H03H 9/725 |
| | | | | 333/195 |
| 2013/0285504 | A1* | 10/2013 | Tamasaki | H03H 9/6483 |
| | | | | 310/313 C |
| 2013/0300519 | A1* | 11/2013 | Tamasaki | H03H 9/54 |
| | | | | 333/195 |
| 2014/0167881 | A1* | 6/2014 | Iwasaki | H03H 9/0222 |
| | | | | 333/133 |
| 2014/0218129 | A1* | 8/2014 | Fujiwara | H03H 9/70 |
| | | | | 333/195 |
| 2015/0365069 | A1* | 12/2015 | Durner | H01F 38/14 |
| | | | | 333/124 |
| 2016/0036415 | A1* | 2/2016 | Ikeuchi | H03H 9/725 |
| | | | | 333/195 |
| 2016/0218696 | A1* | 7/2016 | Nosaka | H03H 9/6423 |
| 2017/0063337 | A1* | 3/2017 | Hara | H03H 9/72 |
| 2017/0244387 | A1* | 8/2017 | Matsuda | H03H 9/173 |
| 2017/0353174 | A1* | 12/2017 | Komatsu | H03H 9/02866 |
| 2018/0041194 | A1* | 2/2018 | Ito | H03H 9/542 |
| 2018/0091118 | A1* | 3/2018 | Saji | H03H 9/6406 |

\* cited by examiner

MULTIPLEXER, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-237808 filed on Dec. 12, 2017. The entire contents of this application are hereby incorporated herein by reference.

BACKGROUND OF THE INVENTION

1. Field of the Invention

The present invention relates to a multiplexer, a high-frequency front-end circuit, and a communication device, the multiplexer including a filter that includes an elastic wave resonator.

2. Description of the Related Art

In recent years, multiplexers that isolate (separate) high-frequency signals for each frequency band have been widely used in communication devices, such as cellular phone terminals, in order to enable each of these communication devices to operate in different frequency bands and support different wireless systems, that is, in order to make these communication devices multi-band and multi-mode devices. As a filter that is used in such a multiplexer, there has been proposed a filter that includes an elastic wave resonator. The elastic wave resonator of the filter includes a piezoelectric substrate, an interdigital transducer (IDT) electrode formed on the piezoelectric substrate, and a dielectric layer formed on the piezoelectric substrate so as to cover the IDT electrode (see, for example, FIG. 13 of International Publication No. 2012/063516).

However, in a filter, such as that described in International Publication No. 2012/063516, that includes an elastic wave resonator having a dielectric layer, there is a problem in that a higher-mode spurious emission is likely to occur in a frequency band (stop band) higher than its pass band.

Such a higher-mode spurious emission will not be a problem for the characteristics of the filter within the pass band of the filter. However, in a multifilter in which paths that pass through a plurality of filters are connected to each other, a higher-mode spurious emission may affect the characteristics of the other filter/filters and may deteriorate the characteristics of the other filters. More specifically, in the case in which the frequency at which a higher-mode spurious emission occurs is within the pass band of one of the other filters, this becomes a factor that causes an increase in a ripple (a passband ripple) in the pass band of the filter.

SUMMARY OF THE INVENTION

Preferred embodiments of the present invention provide multiplexers, high-frequency front-end circuits, and communication devices that are each capable of reducing or preventing the occurrence of a higher-mode spurious emission in a stop band of a filter.

A multiplexer according to a preferred embodiment of the present invention includes a common terminal, a first terminal, a second terminal, a first filter that is disposed on a first path connecting the common terminal and the first terminal to each other and that includes a plurality of elastic wave resonators, and a second filter that is disposed on a second path connecting the common terminal and the second terminal to each other and that has a pass band in a higher frequency than a pass band of the first filter. The plurality of elastic wave resonators include two or more serial resonators that are disposed on the first path and one or more parallel resonators each of which is disposed on a path connecting a node on the first path and a ground to each other. A first serial resonator that is one of the two or more serial resonators and that is closer to the common terminal than a remainder of the two or more serial resonators are is connected to the common terminal without the one or more parallel resonators interposed between the serial resonator and the common terminal. Each of the plurality of elastic wave resonators includes a substrate having piezoelectricity, an IDT electrode including a pair of comb-shaped or substantially comb-shaped electrodes that are provided on the substrate, and a dielectric layer provided on the substrate so as to cover the IDT electrode. The dielectric layer of at least one of the first serial resonator and a first parallel resonator that is one of the one or more parallel resonators and that is closer to the common terminal than a remainder of the one or more parallel resonators are has a thickness smaller than a thickness of the dielectric layer or layers of a remainder of the plurality of elastic wave resonators.

As described above, by setting the thickness of the dielectric layer of the first serial resonator that is closest to the common terminal to be smaller than the thickness of each of the dielectric layers of the other elastic wave resonators, the occurrence of a higher-mode spurious emission in the first serial resonator that significantly affects the second filter is able to be reduced or prevented. As a result, the occurrence of a higher-mode spurious emission in a stop band of the first filter is able to be reduced or prevented, and the insertion loss in the pass band of the second filter is able to be reduced.

The dielectric layer of the first serial resonator and the dielectric layer of the first parallel resonator may each have a thickness smaller than the thickness of the dielectric layer or layers of the remainder of the plurality of elastic wave resonators.

As described above, by setting the thickness of the dielectric layer of the first serial resonator that is closest to the common terminal and the thickness of the dielectric layer of the first parallel resonator that is the second closest to the common terminal to be smaller than the thickness of each of the dielectric layers of the other elastic wave resonators, the occurrence of higher-mode spurious emissions in the first serial resonator and the first parallel resonator is able to be reduced or prevented. As a result, the occurrence of a higher-mode spurious emission in the stop band of the first filter is able to be reduced or prevented, and the insertion loss in the pass band of the second filter is able to be reduced or prevented.

A multiplexer according to a preferred embodiment of the present invention includes a common terminal, a first terminal, a second terminal, a first filter that is disposed on a first path connecting the common terminal and the first terminal to each other and that includes a plurality of elastic wave resonators, and a second filter that is disposed on a second path connecting the common terminal and the second terminal to each other and that has a pass band higher in frequency than a pass band of the first filter. The plurality of elastic wave resonators include one or more serial resonators that are disposed on the first path and two or more parallel resonators each of which is disposed on a path connecting a node on the first path and a ground to each other. The two or more parallel resonators include a first parallel resonator that is located on the common terminal side and a parallel resonator that is located on the first terminal side when seen from a first serial resonator that is one of the one or more serial resonators and that is closer to the common terminal than a remainder of the one or more serial resonators are. Each of the plurality of elastic wave resonators includes a substrate having piezoelectricity, an IDT electrode including a pair of comb-shaped or substantially comb-shaped electrodes that are provided on the substrate, and a dielectric layer provided on the substrate so as to cover the IDT electrode. The dielectric layer of at least one of the first parallel resonator and the first serial resonator has a thickness smaller than a thickness of the dielectric layer or layers of a remainder of the plurality of elastic wave resonators.

As described above, by setting the thickness of the dielectric layer of the first parallel resonator that is closest to the common terminal to be smaller than the thickness of each of the dielectric layers of the other elastic wave resonators, the occurrence of a higher-mode spurious emission in the first parallel resonator that significantly affects the second filter is able to be reduced or prevented. As a result, the occurrence of a higher-mode spurious emission in a stop band of the first filter is able to be reduced or prevented, and the insertion loss in the pass band of the second filter is able to be reduced or prevented.

The dielectric layer of the first parallel resonator and the dielectric layer of the first serial resonator may each have a thickness smaller than the thickness of the dielectric layer or layers of the remainder of the plurality of elastic wave resonators.

As described above, by setting the thickness of the dielectric layer of the first parallel resonator that is closest to the common terminal and the thickness of the dielectric layer of the first serial resonator that is the second closest to the common terminal to be smaller than the thickness of each of the dielectric layers of the other elastic wave resonators, the occurrence of higher-mode spurious emissions in the first parallel resonator and the first serial resonator is able to be reduced or prevented. As a result, the occurrence of a higher-mode spurious emission in the stop band of the first filter is able to be reduced or prevented, and the insertion loss in the pass band of the second filter is able to be reduced or prevented.

Each of the dielectric layers may be provided such that a surface of the dielectric layer is parallel or substantially parallel to a main surface of the corresponding substrate.

With this configuration, resonance characteristics of the elastic wave resonators and transmission characteristics of the filters are further improved compared to a case in which a dielectric layer is provided, for example, along the main surface of the substrate and a surface of the IDT electrode so as to have a shape that includes depressions and projections.

Each of the substrates may be a lithium niobate substrate.

With this configuration, elastic wave resonators each having favorable frequency-temperature characteristics and a large electromechanical coupling coefficient are able to be provided.

A frequency at which a higher-mode spurious emission is caused to occur by the first filter may be included in a frequency pass band of the second filter.

With this configuration, the occurrence of a higher-mode spurious emission in the stop band of the first filter is able to be reduced or prevented, and the insertion loss in the pass band of the second filter is able to be reduced or prevented.

A high-frequency front-end circuit according to a preferred embodiment of the present invention includes one of the multiplexers described above and an amplifier circuit that is connected to the multiplexer.

As a result, the high-frequency front-end circuit capable of reducing or preventing the occurrence of a higher-mode spurious emission in the stop band of the first filter and reducing the insertion loss in the pass band of the second filter is provided.

A communication device according to a preferred embodiment of the present invention includes an RF-signal processing circuit that processes a high-frequency signal that is transmitted and received by an antenna element and the above-described high-frequency front-end circuit that transmits the high-frequency signal between the antenna element and the RF-signal processing circuit.

As a result, the communication device capable of reducing or preventing the occurrence of a higher-mode spurious emission in the stop band of the first filter and reducing the insertion loss in the pass band of the second filter is provided.

According to preferred embodiments of the present invention, the occurrence in a higher-mode spurious emission in a stop band of a filter is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
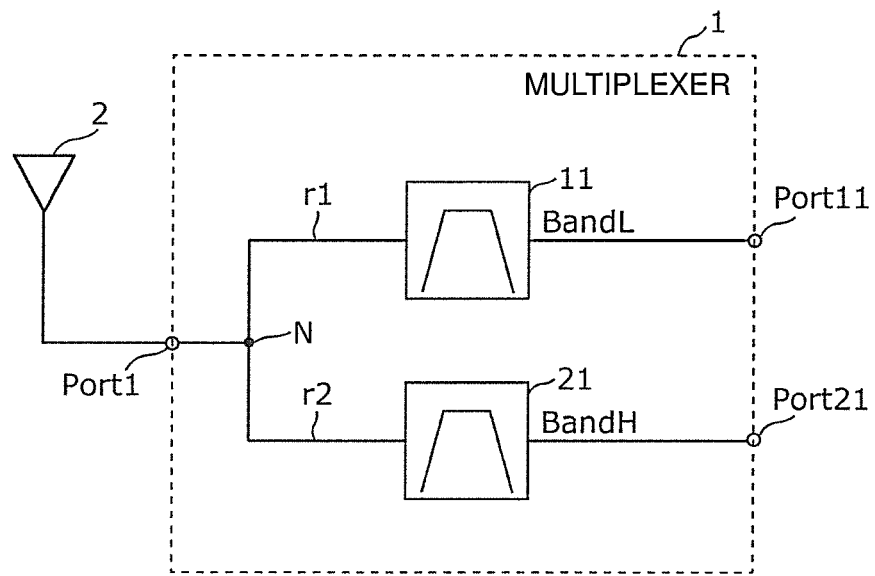
FIG. 1 is a diagram illustrating the basic configuration of a multiplexer common to a preferred embodiment of the present invention and a comparative example.

Details leading to the present invention will be described first with reference to FIG. 1 to FIG. 4. FIG. 1 is a diagram illustrating the basic configuration of a multiplexer 1 common to preferred embodiments of the present invention and a comparative example. Note that FIG. 1 also illustrates an antenna element 2 that is connected to a common terminal Port1.

The multiplexer 1 includes the common terminal Port1, a first terminal Port11, a second terminal Port21, a first filter 11, and a second filter 21. The first filter 11 is disposed on a first path r1 that connects the common terminal Port1 and the first terminal Port11 to each other. The second filter 21 is disposed on a second path r2 that connects the common terminal Port1 and the second terminal Port21 to each other. The second filter 21 is set to have a frequency pass band higher than that of the first filter 11.

Figure 2:
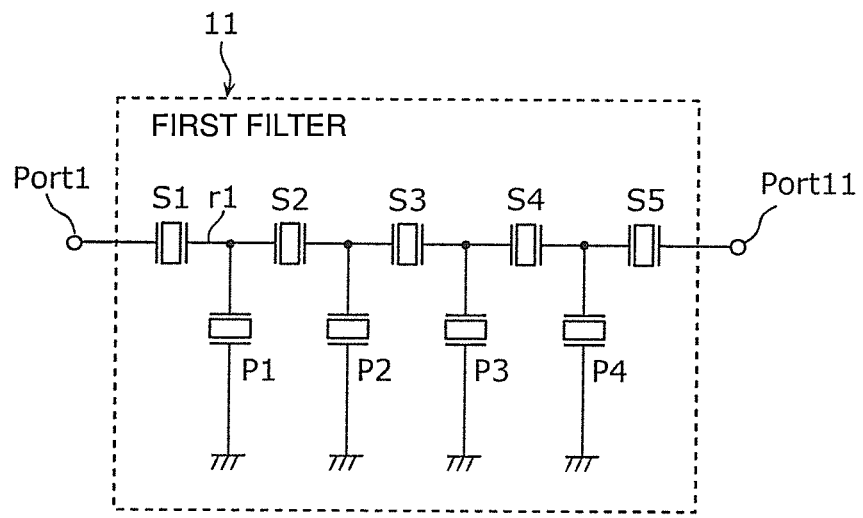
FIG. 2 is a circuit configuration diagram illustrating a first filter of a multiplexer according to a comparative example.

FIG. 2 is a circuit configuration diagram illustrating the first filter 11 of the multiplexer 1 according to the comparative example.

The first filter 11 according to the comparative example is a ladder filter that includes a plurality of elastic wave resonators. The first filter 11 includes serial resonators S1, S2, S3, S4, and S5, which are elastic wave resonators disposed on the first path r1, and parallel resonators P1, P2, P3, and P4, which are elastic wave resonators disposed on paths each of which connects the first path r1 and a ground to each other. The serial resonators S1 to S5 are arranged in this order from the side of the common terminal Port1 toward the side of the first terminal Port11. The parallel resonator P1 is connected between the serial resonators S1 and S2. The parallel resonator P2 is connected between the serial resonators S2 and S3. The parallel resonator P3 is connected between the serial resonators S3 and S4. The parallel resonator P4 is connected between the serial resonators S4 and S5. All or some of the serial resonators S1 to S5 and the parallel resonators P1 to P4 will hereinafter sometimes be referred to as resonators.

Figure 3:
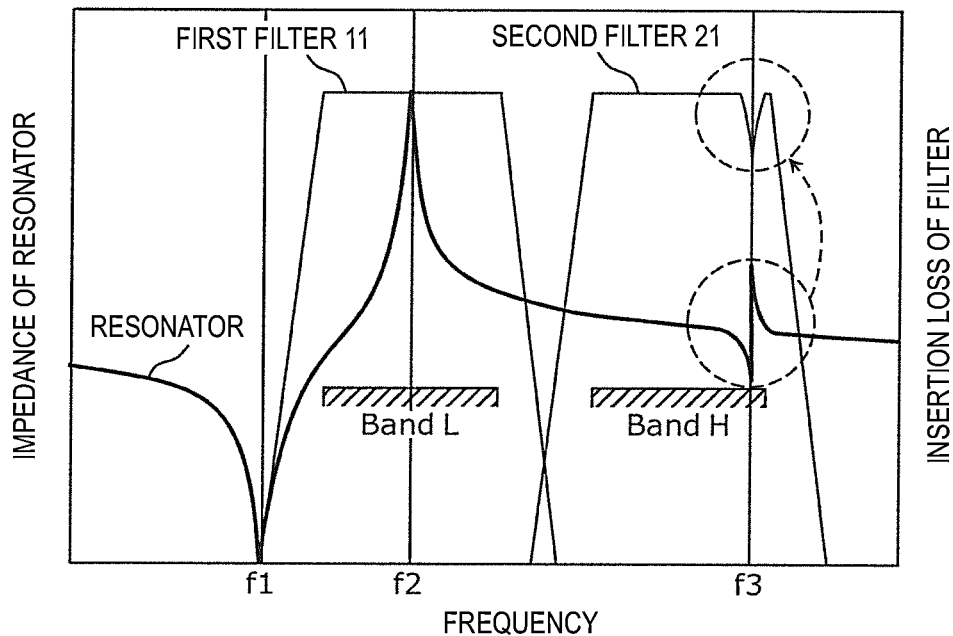
FIG. 3 is a schematic diagram illustrating a higher-mode spurious emission that occurs in a stop band of the first filter according to the comparative example.

A problem that may occur in the multiplexer 1 according to the comparative example will now be described with reference to FIG. 3. FIG. 3 is a schematic diagram illustrating a higher-mode spurious emission that occurs in a stop band of the first filter 11 according to the comparative example. In the graph illustrated in FIG. 3, the bold line denotes impedance characteristics of the serial resonator S1 having a resonant frequency f1 and an anti-resonant frequency f2, and the thin lines denote the insertion losses of the first filter 11 and the second filter 21.

For example, a higher-mode spurious emission appears as ripple fluctuations in the impedance at a frequency higher than the resonance point of a resonator. As illustrated in FIG. 3, when a higher-mode spurious emission caused by one of the resonators of the first filter 11 occurs at a frequency f3, a portion of a signal at the frequency f3, which is to be reflected by the first filter 11, is not reflected and becomes a loss, and a passband ripple appears in the second filter 21. This passband ripple causes an insertion loss in the pass band of the second filter 21. In order to reduce the insertion loss of the second filter 21, it is necessary to reduce or prevent the occurrence of higher-mode spurious emission caused by the resonators of the first filter 11.

In the following description, the higher-mode spurious emission among the higher-mode spurious emissions, which are caused by the plurality of resonators included in the first filter 11, that has more influence than the others on the second filter 21 will be determined. In other words, it will be determined which one of the higher-mode spurious emissions caused by the plurality of resonators is to be reduced or prevented from occurring in order to effectively reduce the insertion loss of the second filter 21.

Figure 4:
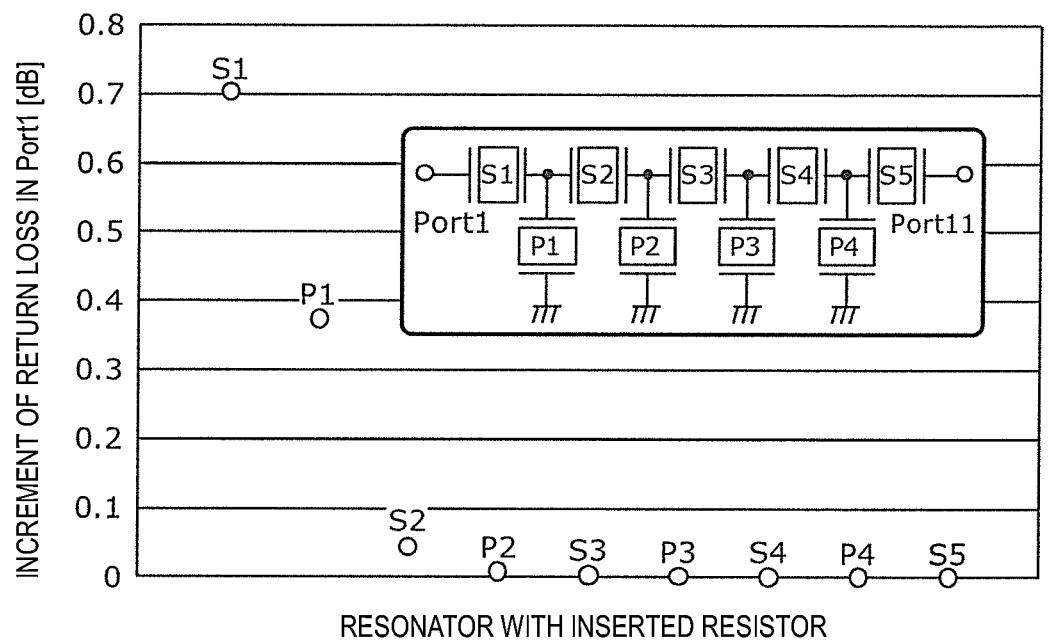
FIG. 4 is a diagram illustrating return loss of the first filter according to the comparative example.

FIG. 4 is a diagram illustrating return loss of the first filter 11 according to the comparative example. FIG. 4 is a diagram illustrating an increment of return loss between a case in which a predetermined frequency signal is input to the first filter 11 from the side of the common terminal Port1 and a case in which a resistor is inserted into one of the plurality of resonators of the first filter 11 and in which the predetermined frequency signal is input to the first filter 11. Note that the predetermined frequency signal that is input to the first filter 11 is a signal including a frequency within the stop band of the first filter 11 and within the pass band of the second filter 21.

The resistor that is inserted into one of the resonators represents, in a simulated manner, a state in which a higher-mode spurious emission occurs in the resonator. The increment of the return loss of the first filter 11 varies depending on which one of the resonators includes the resistor inserted therein, that is, depending on the resonator in which a higher-mode spurious emission occurs.

Here, the term "return loss" refers to the return loss of the first filter 11 when seen from the common terminal Port1, and the larger the return loss, the smaller the amount of signal reflected by the first filter 11. In other words, a frequency signal in the pass band of the second filter 21 is absorbed by the first filter 11, and the insertion loss of the second filter 21 increases.

As illustrated in FIG. 4, the maximum increment of the return loss in the case in which the resistor is inserted into the serial resonator S1 that is closest to the common terminal Port1 is about 0.7 dB, and the maximum increment of the return loss in the case in which the resistor is inserted into the parallel resonator P1 that is the second closest to the common terminal Port1 is about 0.38 dB, for example. The maximum increment of the return loss in the case in which the resistor is inserted into the serial resonator S2 that is the third closest to the common terminal Port1 is about 0.05 dB, for example. The maximum increment of the return loss in the case in which the resistor is inserted into the resonator P2 that is the fourth closest to the common terminal Port1 and the maximum increment of the return loss in each of the cases in which the resistor is inserted into one of the other resonators P3, P4, and S3 to S5 are each about 0 dB, which may be considered to be a state in which there is only a small increase in the return loss. As described above, in the case in which higher-mode spurious emissions occur in the resonators that are close to the common terminal Port1, more specifically, the serial resonator and the parallel resonator each of which is in the first stage on the side of the common terminal Port1, the increment of the return loss in the first filter 11 is larger than the increment of the return loss in the first filter 11 in the case in which higher-mode spurious emissions occur in the other resonators. Therefore, in order to reduce the insertion loss of the second filter 21, it is effective to take measures to reduce or prevent the occurrence of higher-mode spurious emissions in the serial resonator and the parallel resonator that are in the first stage on the side of the common terminal Port1.

In a multiplexer 1 according to a preferred embodiment of the present invention, one of the resonators, which are included in the first filter 11, that is positioned close to the common terminal Port1 has a structure that reduces or prevents the occurrence of a higher-mode spurious emission. As a result, the insertion loss in the pass band of the second filter 21 is able to be reduced.

The preferred embodiments of the present invention will be described in detail below with reference to the drawings. Note that the preferred embodiments, which will be described below, are comprehensive or specific examples. Numerical values, shapes, materials, components, arrangement positions and connection configurations of the components, and features and elements that are described in the following preferred embodiments are examples and are not intended to limit the scope of the present invention. Among the components in the following preferred embodiments, the components that are not described in the independent claims will be described as arbitrary and/or optional components. In addition, the sizes of the components illustrated in the drawings or the ratio of their sizes are not necessarily exact. In the drawings, components that have the same or substantially the same configurations are denoted by the same reference signs, and repeated descriptions may sometimes be omitted or simplified. Furthermore, in the following preferred embodiments, the term "be connected" includes not only a case of being directly connected but also a case of being electrically connected via other elements.

First Preferred Embodiment

A multiplexer 1 according to a first preferred embodiment of the present invention will be described with reference to FIG. 1 and FIG. 5 to FIG. 9. Note that there are some components that are common to the first preferred embodiment and the above-described comparative example, and the common components will be described anew together with the other components of the first preferred embodiment.

The multiplexer 1 (duplexer) according to the first preferred embodiment includes a plurality of filters having different pass bands and in which terminals of the plurality of filters on an antenna side are bundled together by a common terminal Port1. More specifically, as illustrated in FIG. 1, the multiplexer 1 includes the common terminal Port1, a first terminal Port11, a second terminal Port21, a first filter 11, and a second filter 21.

The common terminal Port1 is shared by the first filter 11 and the second filter 21 and is connected to the first filter 11 and the second filter 21 in the multiplexer 1. In addition, the common terminal Port1 is connected to an antenna element 2 outside the multiplexer 1. In other words, the common terminal Port1 also defines and functions as an antenna terminal of the multiplexer 1.

The first terminal Port11 is connected to the first filter 11 in the multiplexer 1. The second terminal Port21 is connected to the second filter 21 in the multiplexer 1. The first terminal Port11 and the second terminal Port21 are connected to an RF-signal processing circuit (for example, a radio frequency integrated circuit (RFIC)), which is not illustrated, via an amplifier circuit or other suitable circuit (not illustrated) outside the multiplexer 1.

The first filter 11 is disposed on a first path r1 that connects the common terminal Port1 and the first terminal Port11 to each other. The first filter 11 is, for example, a reception filter that uses a downstream frequency band (reception band) in a low band BandL as its pass band.

The second filter 21 is disposed on a second path r2 that connects the common terminal Port1 and the second terminal Port21 to each other. The second filter 21 is, for example, a reception filter that uses a downstream frequency band (reception band) in a high band BandH as its pass band.

The first filter 11 and the second filter 21 are each required to have characteristics to pass a frequency band (reception band or transmission band) of a corresponding one of the low band BandL and the high band BandH and to attenuate the other bands. In the present preferred embodiment, the second filter 21 is set to have a frequency pass band higher than that of the first filter 11.

The first path r1 and the second path r2 are connected to each other at a node N. In other words, the node N is a point at which the first path r1 and the second path r2 are brought together. Note that, in the multiplexer 1, an impedance element that provides impedance matching may be connected to, for example, the first path r1 connecting the first filter 11 and the node N to each other, the second path r2 connecting the second filter 21 and the node N to each other, or a path connecting the node N and the common terminal Port1 to each other.

The configurations of the first filter 11 and the second filter 21 will now be described using the first filter 11, which uses the low band BandL as its pass band, as an example.

Figure 5:
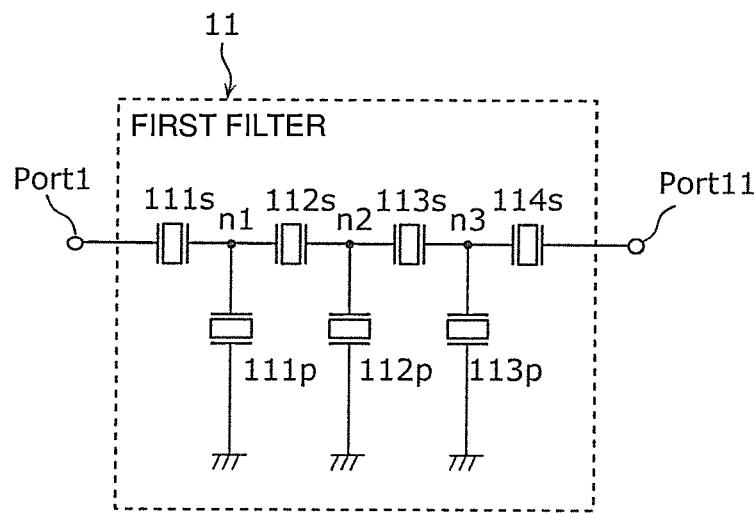
FIG. 5 is a circuit configuration diagram illustrating a first filter of a multiplexer according to a first preferred embodiment of the present invention.

FIG. 5 is a circuit configuration diagram illustrating the first filter 11. As illustrated in FIG. 5, the first filter 11 includes serial resonators 111$s$, 112$s$, 113$s$, and 114$s$ and parallel resonators 111$p$, 112$p$, and 113$p$, which are elastic wave resonators. All or some of the serial resonators 111$s$ to 114$s$ and the parallel resonators 111$p$ to 113$p$ will hereinafter sometimes be referred to as resonators 110.

The serial resonators 111$s$ to 114$s$ are disposed on the first path (serial arm) r1, which connects the common terminal Port1 and the first terminal Port11 to each other, in this order from the side of the common terminal Port1 so as to be connected in series to one another. The parallel resonators 111$p$ to 113$p$ are disposed on paths (parallel arms) each of which connects one of nodes n1, n2, and n3 and a reference terminal (ground) to each other, the nodes n1, n2, and n3 being located between adjacent ones of the serial resonators 111$s$ to 114$s$ on the first path r1, and the parallel resonators 111$p$ to 113$p$ are connected in parallel to one another. More specifically, the serial resonator (first serial resonator) 111$s$ that is closest to the common terminal Port1 is connected to the common terminal Port1 without the parallel resonators 111$p$ to 113$p$ interposed therebetween. Among the parallel resonators 111$p$ to 113$p$, the parallel resonator (first parallel resonator) 111$p$ is closest to the common terminal Port1. First ends of the parallel resonators 111$p$ to 113$p$ are each connected to one of the nodes n1, n2, and n3, and second ends of the parallel resonators 111p to 113p are each connected to one of the reference terminals.

As described above, the first filter 11 preferably has a T-shaped or substantially T-shaped ladder filter structure including two or more serial resonators (the four serial resonators in the present preferred embodiment) that are disposed on the first path r1 and one or more parallel resonators (the three parallel resonators in the present preferred embodiment) that are disposed on the paths each connecting the first path r1 and one of the reference terminals (ground) to each other.

Note that, in the first filter 11, the number of the serial resonators and the number of the parallel resonators are not limited to four and three, respectively, and it is only necessary for the first filter 11 to include two or more serial resonators and one or more parallel resonators. In addition, each of the parallel resonators may be connected to the corresponding reference terminal by an inductor. Furthermore, impedance elements, such as an inductor and a capacitor, may be inserted into or connected to the serial arm or the parallel arms. In FIG. 5, although the reference terminals, to which the parallel resonators are connected, are individualized, whether to individualize the reference terminals or to allow commonality of the reference terminals may be suitably selected in accordance with, for example, the limitations on the mounting layout of the first filter 11 and other factors.

The structure of the resonators 110 included in the first filter 11 will now be described. The resonators 110 in the present preferred embodiment are preferably surface acoustic wave (SAW) resonators, for example.

Note that the second filter 21, which is the other filter, is not limited to having the above-described filter configuration and may be suitably designed in accordance with required filter characteristics and other factors. More specifically, the second filter 21 does not need to have a ladder filter structure and may have, for example, a longitudinally-coupled filter structure. In addition, the resonators included in the second filter 21 are not limited to SAW resonators and may be, for example, bulk acoustic wave (BAW) resonators. Furthermore, the second filter 21 may be provided without using a resonator and may be, for example, an LC resonance filter or a dielectric filter.

Figure 6:
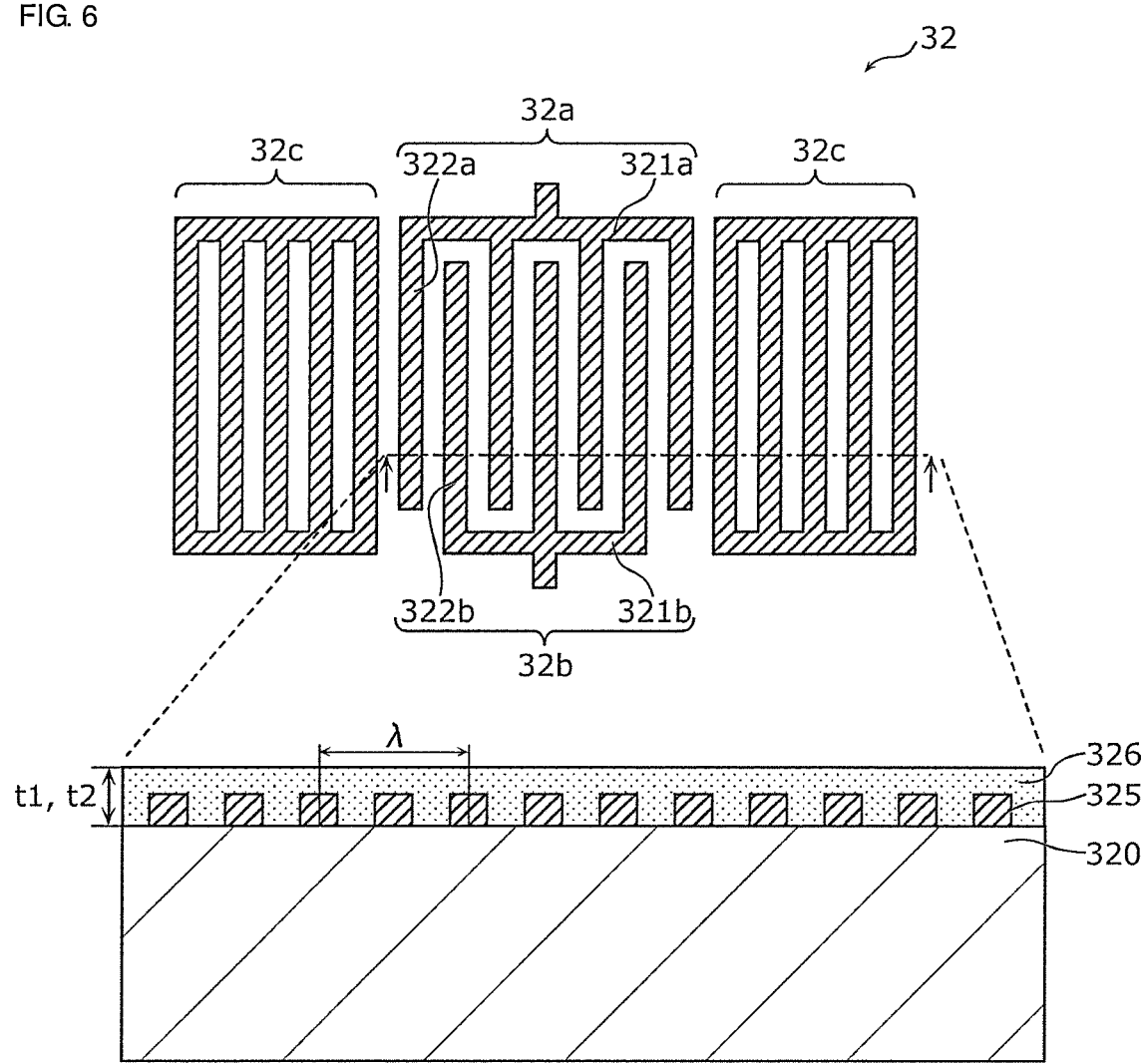
FIG. 6 includes a plan view and a sectional view each schematically illustrating an elastic wave resonator of the first filter according to the first preferred embodiment of the present invention.

FIG. 6 includes a plan view and a sectional view schematically illustrating one of the elastic wave resonators 110 of the first filter 11. Note that FIG. 6 illustrates the resonator 110 for describing a typical structure of each of the above-described resonators 110, and the number of electrode fingers in each electrode, the lengths of the electrode fingers, and other features and elements are not limited to those illustrated in FIG. 6.

As illustrated in the plan view included in FIG. 6, the resonator 110 includes a pair of comb-shaped electrodes 32a and 32b that face each other and a pair of reflectors 32c that are disposed in an elastic-wave propagation direction D1 with respect to the comb-shaped electrodes 32a and 32b. The pair of comb-shaped electrodes 32a and 32b are included in an IDT electrode 32.

The comb-shaped electrode 32a has a comb shape or a substantially comb shape and includes a plurality of electrode fingers 322a that are parallel or substantially parallel to one another and a busbar electrode 321a that connects ends of the plurality of electrode fingers 322a to one another. The comb-shaped electrode 32b has a comb shape or a substantially comb shape and includes a plurality of electrode fingers 322b that are parallel or substantially parallel to one another and a busbar electrode 321b that connects ends of the plurality of electrode fingers 322b to one another. The plurality of electrode fingers 322a and 322b extend in a direction perpendicular or substantially perpendicular to the elastic-wave propagation direction D1. In the IDT electrode 32 according to the present preferred embodiment, for example, preferably a wave length λ is about 4 μm, the duty ratio is about 0.5, the intersecting width is about 80 μm, and the number of pairs is about 100.

The pair of reflectors 32c sandwich the pair of comb-shaped electrodes 32a and 32b in the elastic-wave propagation direction D1. Each of the reflectors 32c includes a plurality of reflective electrode fingers that are parallel or substantially parallel to one another and a reflector busbar electrode that connects the plurality of reflective electrode finger to one another. The plurality of reflective electrode fingers extend in the direction perpendicular or substantially perpendicular to the elastic-wave propagation direction D1.

As illustrated in the sectional view included in FIG. 6, the resonator 110 includes a substrate 320 having piezoelectricity, an electrode layer 325 defining the IDT electrode 32, and a dielectric layer 326 provided on the substrate 320 so as to cover the IDT electrode 32. Note that the sectional structure of each of the reflectors 32c is the same as or similar to the sectional structure of the IDT electrode 32, and thus, description thereof will be omitted in the following description.

The substrate 320 is preferably, for example, a lithium niobate ($LiNbO_3$) substrate having a cut angle of about 127.5°. In the case in which a Rayleigh wave is used as an elastic wave that propagates in the substrate 320 in an X direction, it is preferable that the cut angle of the substrate 320 is about 120°±about 20° or about 300°±about 20°, for example.

The electrode layer 325 includes a plurality of metallic layers that are laminated together. For example, the electrode layer 325 is preferably provided by laminating a Ti layer, an Al layer, a Ti layer, a Pt layer, and a NiCr layer in this order starting from the bottom. The thickness of the electrode layer 325 is preferably, for example, about 278 nm.

The dielectric layer 326 is preferably, for example, a film including a silicon dioxide ($SiO_2$) as a main component. The dielectric layer 326 is provided to, for example, adjust the frequency-temperature characteristics of the resonator 110, to protect the electrode layer 325 against an external environment, or to improve humidity resistance. The thickness of the dielectric layer 326 is larger than the thickness of the electrode layer 325. The dielectric layer 326 is preferably formed by, for example, performing reactive ion etching such that a surface of the dielectric layer 326 is formed flat, and the surface of the dielectric layer 326 is parallel or substantially parallel to a main surface of the substrate 320.

In the present preferred embodiment, a thickness t1 of the dielectric layer 326 of the serial resonator 111s is set to be smaller than a thickness t2 of each of the dielectric layers 326 of the resonators 112s to 114s and 111p to 113p that are in stages subsequent to the serial resonator 111s (that are located on the side of the first terminal Port11). For example, preferably, when the thickness t1 of the dielectric layer 326 of the serial resonator 111s is about 1,000 nm, the thickness t2 of each of the dielectric layers 326 of the other resonators excluding the serial resonator 111s, which are the resonators 112s to 114s and 111p to 113p, is about 1,100 nm.

As described above, the thickness t1 of the dielectric layer 326 of the serial resonator 111s is set to be smaller than the thickness t2 of each of the dielectric layers 326 of the resonators 112s to 114s and 111p to 113p, so that the occurrence of a higher-mode spurious emission in the serial resonator 111s that significantly affects the second filter 21 is able to be reduced or prevented.

Note that the thickness t1 or t2 of one of the dielectric layers 326 is the distance from the main surface of the substrate 320 to the surface of the dielectric layer 326. The thicknesses t2 of the dielectric layers 326 of the resonators 112s to 114s and 111p to 113p may be the same as or similar to one another or may be different from one another.

Figure 7:
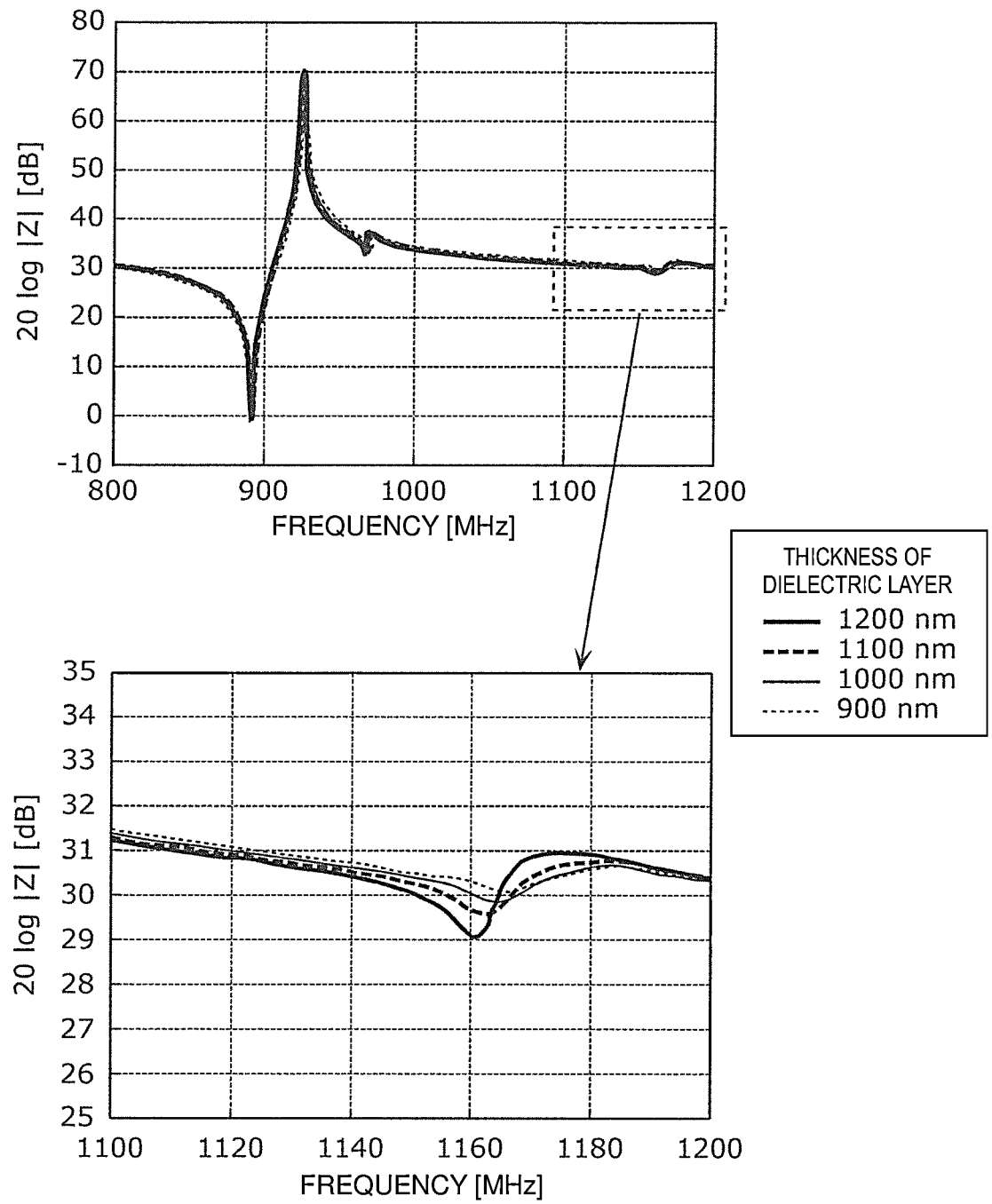
FIG. 7 is a graph illustrating variations in the impedance of the elastic wave resonator according to the first preferred embodiment of the present invention.

FIG. 7 is a graph illustrating variations in the impedance of one of the resonators 110 according to the first preferred embodiment. More specifically, FIG. 7 is a graph illustrating the relationship between frequency and impedance when the thickness t1 of the dielectric layer of the serial resonator 111s is changed. Note that FIG. 7 illustrates resonance characteristics in a Rayleigh mode.

As illustrated in FIG. 7, in the serial resonator 111s, impedance fluctuations occur, and a higher-mode spurious emission appears around a frequency of about 1,165 MHz, which is included in the stop band of the first filter 11. When the impedance fluctuations are observed for each thickness t1 of the dielectric layer 326, the impedance fluctuations are large when the thickness t1 is about 1,200 nm, and as the thickness t1 is reduced, in a stepwise manner, to about 1,100 nm, to about 1,000 nm, and to about 900 nm, the impedance fluctuations become smaller. For example, when the thickness t1 of the dielectric layer 326 is about 900 nm, the impedance fluctuations in the stop band of the first filter 11 are small, and the level of the higher-mode spurious emission is decreased.

Note that, in FIG. 7, although a stop-band response appears around a frequency of about 960 MHz, this stop-band response is able to be reduced by taking other measures.

Figure 8:
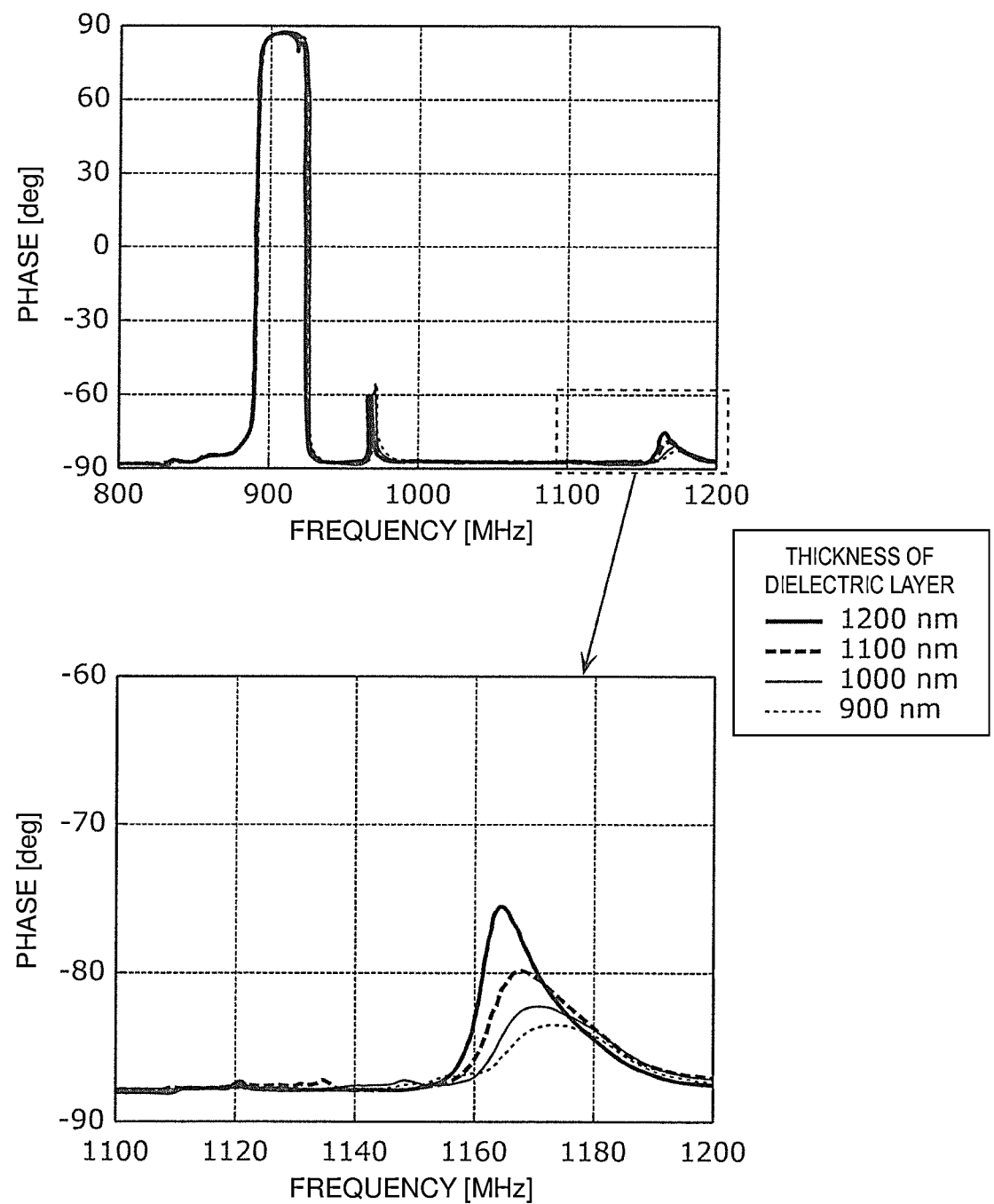
FIG. 8 is a graph illustrating a relationship between frequency and phase of the elastic wave resonator according to the first preferred embodiment of the present invention.

FIG. 8 is a graph illustrating a relationship between frequency and phase of one of the resonators 110 and is a graph illustrating the impedance illustrated in FIG. 7 converted into a phase by using scattering parameters (S-parameters). By converting the impedance into a phase as illustrated in FIG. 8, variations in a higher-mode spurious emission that occur when the thickness t1 of the dielectric layer 326 is notably changed appear as the differences between phases.

As illustrated in FIG. 8, in the serial resonator 111s, the phases are large, and a higher-mode spurious emission appears around a frequency of about 1,165 MHz, which is included in the stop band of the first filter 11. When the phases are observed for each thickness t1 of the dielectric layer 326, the phase is large when the thickness t1 is about 1,200 nm, and as the thickness t1 is reduced in a stepwise manner, the phase becomes smaller. For example, when the thickness t1 of the dielectric layer 326 is about 900 nm, the phase in the stop band of the first filter 11 is small, and the level of the higher-mode spurious emission is decreased. In addition, as the thickness t1 is reduced in a stepwise manner, the peak of a mountain shape of the spurious emission shifts to the high-frequency side. For example, in the case in which the pass band of the second filter 21 is located farther toward the low-frequency side than a frequency band in which a higher-mode spurious emission occurs is, the frequency band in which the higher-mode spurious emission occurs is able to be set apart from the pass band of the second filter 21 by reducing the thickness t1.

Figure 9:
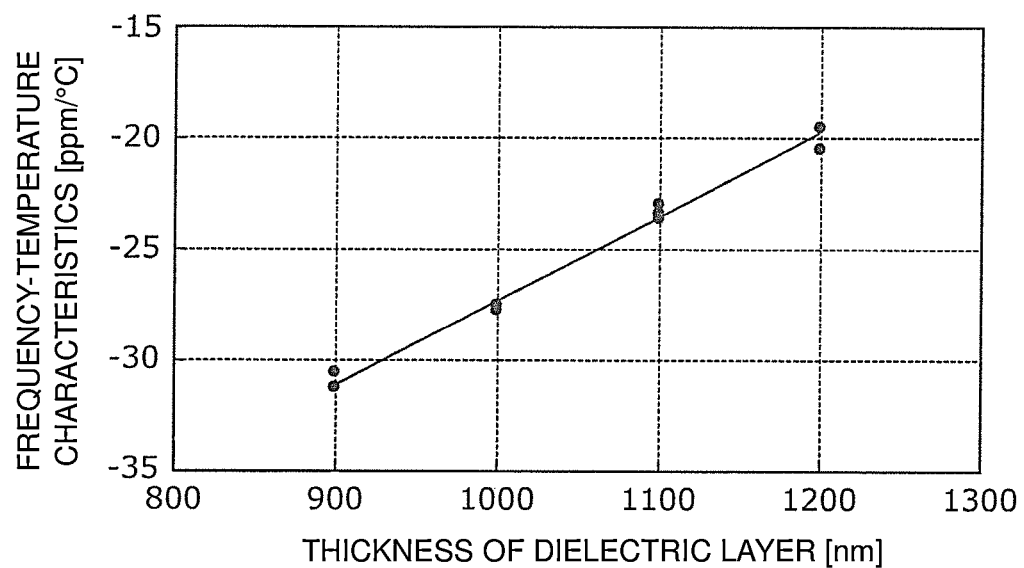
FIG. 9 is a graph illustrating an example of frequency-temperature characteristics of the elastic wave resonator according to the first preferred embodiment of the present invention.

FIG. 9 is a graph illustrating an example of the frequency-temperature characteristics of one of the resonators 110. FIG. 9 illustrates the fact that the frequency-temperature characteristics deteriorate as the dielectric layer 326 becomes thin. For example, it may be considered to reduce the thicknesses of the dielectric layers 326 of all of the resonators 110 included in the first filter 11 in order to reduce the level of a higher-mode spurious emission. In this case, however, the frequency-temperature characteristics deteriorate as illustrated in FIG. 9. In the present preferred embodiment, among the dielectric layers 326 of all of the resonators 110, the dielectric layer 326 of the serial resonator 111s that significantly affects the second filter 21 is reduced instead of reducing the thicknesses of the dielectric layers 326 of all of the resonators 110. As a result, the occurrence of a higher-mode spurious emission in the first filter 11 is able to be reduced or prevented, and the insertion loss in the pass band of the second filter 21 is able to be reduced.

The multiplexer 1 according to the present preferred embodiment includes the common terminal Port1, the first terminal Port11, the second terminal Port21, the first filter 11 that is disposed on the first path r1 connecting the common terminal Port1 and the first terminal Port11 to each other and that includes the plurality of elastic wave resonators 111s to 114s and 111p to 113p, and the second filter 21 that is disposed on the second path r2 connecting the common terminal Port1 and the second terminal Port21 to each other and that has a pass band higher in frequency than that of the first filter 11. The plurality of elastic wave resonators include two or more serial resonators (e.g., the serial resonators 111s to 114s) that are disposed on the first path r1 and one or more parallel resonator (e.g., the parallel resonators 111p to 113p) that are disposed on the paths each connecting one of the nodes on the first path r1 and the ground to each other. Among the two or more serial resonators 111s to 114s, the first serial resonator 111s that is closest to the common terminal Port1 is connected to the common terminal Port1 without the parallel resonators 111p to 113p interposed therebetween. Each of the plurality of elastic wave resonators includes the substrate 320 that has piezoelectricity, the IDT electrode 32 that includes the pair of comb-shaped electrodes 32a and 32b provided on the substrate 320, and the dielectric layer 326 that is provided on the substrate 320 so as to cover the IDT electrode 32. The dielectric layer 326 of the first serial resonator 111s has a thickness smaller than the thickness of each of the dielectric layers 326 of the plurality of elastic wave resonators 112s to 114s and 111p to 113p.

As described above, by setting the thickness t1 of the dielectric layer 326 of the serial resonator 111s, which is closest to the common terminal Port1, to be smaller than the thickness t2 of each of the dielectric layers 326 of the elastic wave resonators 112s to 114s and 111p to 113p in the subsequent stages, the occurrence of a higher-mode spurious emission in the serial resonator 111s that significantly affects the second filter 21 is able to be reduced or prevented. As a result, the occurrence of a higher-mode spurious emission in the first filter 11 is able to be reduced or prevented, and the insertion loss in the pass band of the second filter 21 is able to be reduced or prevented.

In the multiplexer 1 according to a first modification of the first preferred embodiment, among one or more parallel resonators, the parallel resonator that is closest to the common terminal Port1 includes the dielectric layer 326 that is thinner than each of the dielectric layers 326 of the other resonators in the subsequent stages.

Figure 10:
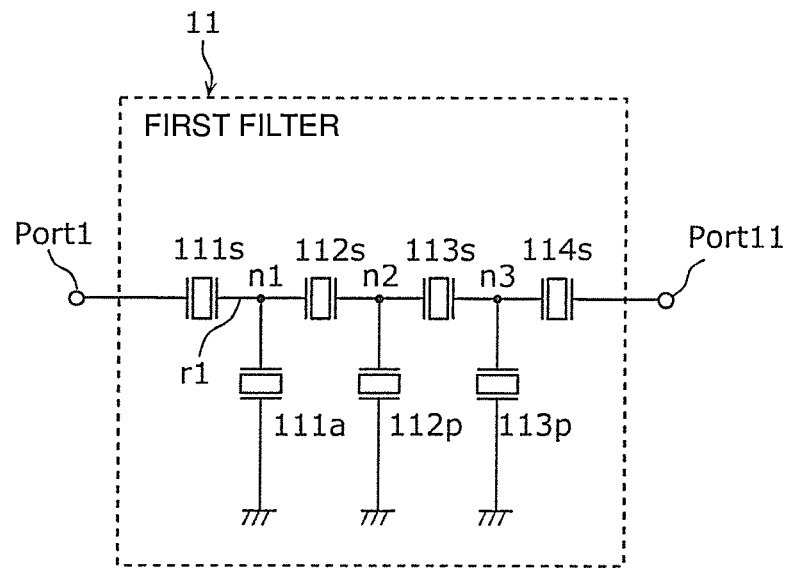
FIG. 10 is a circuit configuration diagram of a first filter according to a first modification of the first preferred embodiment of the present invention.

FIG. 10 is a circuit configuration diagram of the first filter 11 according to the first modification of the first preferred embodiment. The first filter 11 according to the first modification includes a parallel resonator 111a, instead of the parallel resonator 111p according to the first preferred embodiment. Among the plurality of parallel resonators 111a, 112p, and 113p, the parallel resonator 111a is disposed so as to be closest to the common terminal Port1.

In the multiplexer 1 according to the first modification, not only the thickness t1 of the dielectric layer 326 of the serial resonator 111s, but also the thickness t1 of the dielectric layer 326 of the parallel resonator 111a are each set to be smaller than the thickness t2 of each of the dielectric layers 326 of the resonators 112s to 114s, 112p, and 113p that are in the stages subsequent to the parallel resonator 111a (that are located on the side of the first terminal Port11). Among the resonators 110 included in the first filter 11, the parallel resonator 111a that affects the second filter 21 has the above-described configuration, so that the occurrence of a higher-mode spurious emission in the stop band of the first filter 11 is able to be further reduced or prevented.

In the multiplexer 1 according to a second modification of the first preferred embodiment, the serial resonator 111s of the first filter 11 is divided into two resonators.

Figure 11:
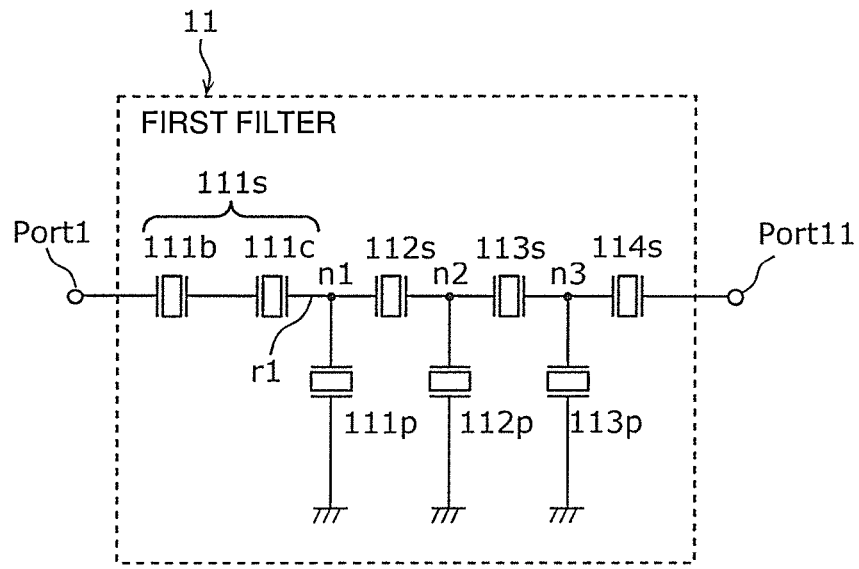
FIG. 11 is a circuit configuration diagram of a first filter according to a second modification of the first preferred embodiment of the present invention.

FIG. 11 is a circuit configuration diagram of the first filter 11 according to the second modification of the first preferred embodiment. As illustrated in FIG. 11, in the multiplexer 1 according to the second modification, the serial resonator 111s of the first filter 11 includes two serial resonators 111b and 111c that are arranged in series. The dielectric layer 326 of the serial resonator 111b, which is closer to the common terminal Port1 than the serial resonator 111c is, has the thickness t1, and also the dielectric layer 326 of the serial resonator 111c, which is positioned between the serial resonator 111b and the node n1, has the thickness t1.

In the multiplexer 1 according to the second modification, the thickness t1 of each of the dielectric layers 326 of the serial resonators 111b and 111c, which define the serial resonator 111s that is closest to the common terminal Port1, is smaller than the thickness t2 of each of the dielectric layers 326 of the resonators 112s to 114s and 111p to 113p, which are in stages subsequent to the node n1 (that are located on the side of the first terminal Port11). As a result, the occurrence of a higher-mode spurious emission in the stop band of the first filter 11 is able to be reduced or prevented.

Second Preferred Embodiment

The difference between the multiplexer 1 according to a second preferred embodiment of the present invention and the multiplexer 1 according to the first preferred embodiment is that a first filter 11A has a π-shaped or substantially π-shaped ladder filter structure that is different from the T-shaped or substantially T-shaped ladder filter structure of the first filter 11 according to the first preferred embodiment.

Figure 12:
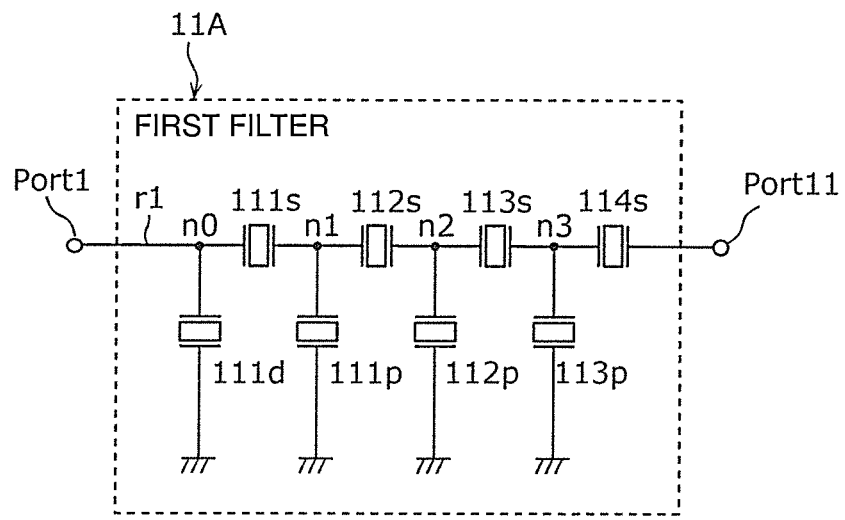
FIG. 12 is a circuit configuration diagram of a first filter of a multiplexer according to a second preferred embodiment of the present invention.

FIG. 12 is a circuit configuration diagram of the first filter 11A of the multiplexer 1 according to the second preferred embodiment. As illustrated in FIG. 12, the first filter 11A includes the serial resonators 111s to 114s, a parallel resonator 111d, and the parallel resonators 111p to 113p.

The serial resonators 111s to 114s are disposed on the first path (serial arm) r1, which connects the common terminal Port1 and the first terminal Port11 to each other, in this order from the side of the common terminal Port1 so as to be connected in series to one another. The parallel resonators 111d and 111p to 113p include the parallel resonator 111d that is located on the side of the common terminal Port1 when viewed from the serial resonator (first serial resonator) 111s, which is closer to the common terminal Port1 than the other serial resonators 111s to 114s are, and the parallel resonators 111p to 113p that are located on the side of the first terminal Port11 when viewed from the serial resonator 111s. The parallel resonator 111d is connected to a path (parallel arm) connecting a node n0 located between the common terminal Port1 and the serial resonator 111s and a reference terminal (ground) to each other. More specifically, the parallel resonator 111d that is closest to the common terminal Port1 is connected to the common terminal Port1 without the serial resonators 111s to 114s interposed therebetween. In addition, the parallel resonators 111p to 113p are disposed on the paths each connecting one of the nodes n1, n2, and n3, which are located between adjacent ones of the serial resonators 111s to 114s on the first path r1, and one of the reference terminals to each other, and the parallel resonators 111p to 113p are connected in parallel to one another.

As described above, the first filter 11A has a 7L-shaped or substantially π-shaped ladder filter structure that includes one or more serial resonators (e.g., the four serial resonators 111s to 114s) that are disposed on the first path r1 and two or more parallel resonators (e.g., the four parallel resonators 111d and 111p to 113p) that are disposed on the paths each connecting the first path r1 and one of the reference terminals to each other.

In the present preferred embodiment, the thickness t1 of the dielectric layer 326 of the parallel resonator 111d is set to be smaller than the thickness t2 of each of the dielectric layers 326 of the resonators 111s to 114s and 111p to 113p that are in the stages subsequent to the parallel resonator 111d (that are located on the side of the first terminal Port11). For example, when the thickness t1 of the dielectric layer 326 of the parallel resonator 111d is about 1,000 nm, the thickness t2 of each of the dielectric layers 326 of the other resonators excluding the parallel resonator 111d, which are the resonators 111s to 114s and 111p to 113p, is preferably about 1,100 nm.

As described above, the thickness t1 of the dielectric layer 326 of the parallel resonator 111d is smaller than the thickness t2 of each of the dielectric layers 326 of the resonators 111s to 114s and 111p to 113p in the subsequent stages, so that the occurrence of a higher-mode spurious emission in the parallel resonator 111d that significantly affects the second filter 21 is able to be reduced or prevented.

Note that the thicknesses t2 of the dielectric layers 326 of the resonators 111s to 114s and 111p to 113p may be the same or substantially the same as one another or may be different from one another.

In addition, in the second preferred embodiment, although a case has been described in which the dielectric layer 326 of the parallel resonator 111d has the thickness t1, the dielectric layer 326 of the serial resonator 111s may also have the thickness t1.

In other words, in the first filter 11A, among the dielectric layers 326 of one or more serial resonators (e.g., the serial resonators 111s to 114s), the dielectric layer 326 of the serial resonator 111s, which is closest to the common terminal Port1, may have the thickness t1 that is smaller than the thickness t2 of each of the dielectric layers 326 of the resonators 112s to 114s and 111p to 113p that are in the stages subsequent to the serial resonator 111s (that are located on the side of the first terminal Port11). In addition to the parallel resonator 111d, the serial resonator 111s has the above-described configuration, so that the occurrence of a higher-mode spurious emission in the stop band of the first filter 11A is able to be further reduced or prevented.

In the multiplexer 1 according to a first modification of the second preferred embodiment, the parallel resonator 111d of the first filter 11A is divided into four resonators.

Figure 13:
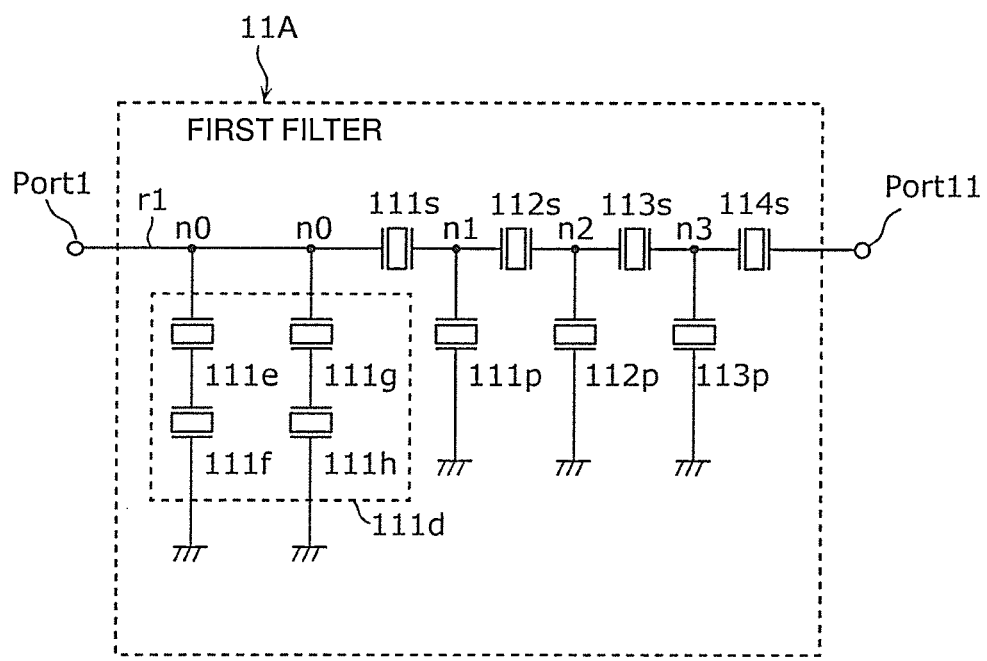
FIG. 13 is a circuit configuration diagram of a first filter according to a first modification of the second preferred embodiment of the present invention.

FIG. 13 is a circuit configuration diagram of the first filter 11A according to the first modification of the second preferred embodiment. As illustrated in FIG. 13, the first filter 11A includes the serial resonators 111s to 114s and the parallel resonators 111d and 111p to 113p. The parallel resonator 111d includes parallel resonators 111e, 111f, 111g, and 111h that are separated from one another.

The parallel resonators 111e and 111f are connected in series and are connected to a path that connects a node n0 located between the common terminal Port1 and the serial resonator 111s and a reference terminal to each other. The parallel resonators 111g and 111h are connected in series and are connected to a path that connects another node n0 located between the common terminal Port1 and the serial resonator 111s and a reference terminal to each other. More specifically, the parallel resonators 111e and 111f, which are closer to the common terminal Port1 than the other parallel resonators are, are each connected to the corresponding node n0 without the serial resonators 111s to 114s interposed therebetween. Similarly, the parallel resonators 111g and 111h that are the third and the fourth closest to the common terminal Port1 are each connected to the corresponding node n0 without the serial resonators 111s to 114s interposed therebetween.

As described above, the first filter 11A has a n-shaped or substantially n-shaped ladder filter structure that includes one or more serial resonators that are disposed on the first path r1 and two or more parallel resonators (e.g., the seven parallel resonators 111e to 111h and 111p to 113p) that are disposed on the paths each connecting the first path r1 and one of the reference terminals to each other.

In the first modification of the second preferred embodiment, the thickness t1 of each of the dielectric layers 326 of the parallel resonators 111e to 111h is smaller than the thickness t2 of each of the dielectric layers 326 of the resonators 111s to 114s and 111p to 113p that are in the stages subsequent to the parallel resonators 111e to 111h (that are located on the side of the first terminal Port11). The resonators 110 included in the first filter 11A have the above-described configurations, so that the occurrence of a higher-mode spurious emission in the stop band of the first filter 11A is able to be reduced or prevented.

Third Preferred Embodiment

The differences between the multiplexer 1 according to a third preferred embodiment of the present invention and the multiplexer 1 according to the first preferred embodiment are that a Love wave is used as an elastic wave and that a silicon dioxide film is provided between the substrate 320 and the electrode layer 325.

Figure 14:
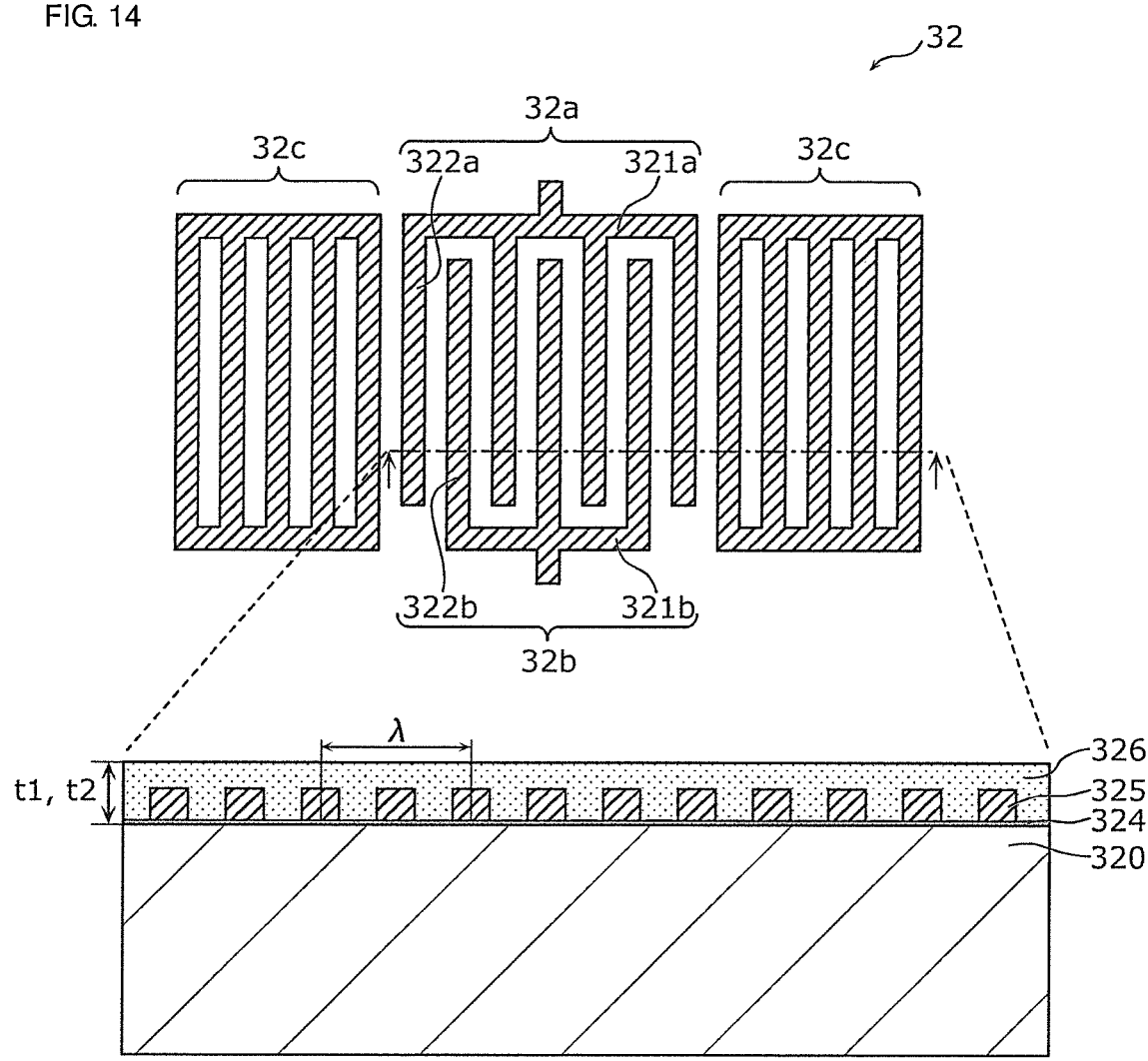
FIG. 14 includes a plan view and a sectional view each schematically illustrating an elastic wave resonator of a first filter according to a third preferred embodiment of the present invention.

The resonator 110 illustrated in the sectional view in FIG. 14 includes the substrate 320, the electrode layer 325, and the dielectric layer 326.

The substrate 320 is preferably, for example, a lithium niobate ($LiNbO_3$) substrate having a cut angle of about 176°. In the case in which a Love wave is used as an elastic wave that propagates in the substrate 320 in the X direction, it is preferable that the cut angle of the substrate 320 be about 0°±about 20° or be about 180°±about 20°, for example.

A silicon dioxide film ($SiO_2$ film) 324 that includes a dielectric material is provided on the main surface of the substrate 320. The silicon dioxide film 324 is used to adjust an electromechanical coupling coefficient and preferably has a thickness of, for example, about 25 nm.

The electrode layer 325 is provided on the silicon dioxide film 324. The electrode layer 325 includes a plurality of metallic layers that are laminated together and is preferably formed by, for example, laminating a Ti layer, an Al layer, a Ti layer, a Pt layer, and a NiCr layer in this order starting from the bottom. The thickness of the electrode layer 325 is preferably, for example, about 310 nm.

The dielectric layer 326 is provided on the substrate 320 so as to cover the IDT electrode 32. More specifically, the dielectric layer 326 is formed flat such that the surface of the dielectric layer 326 is parallel or substantially parallel to the main surface of the substrate 320.

In the present preferred embodiment, the thickness t1 of the dielectric layer 326 of the serial resonator 111s is set to be smaller than the thickness t2 of each of the dielectric layers 326 of the resonators 112s to 114s and 111p to 113p that are in the stages subsequent to the serial resonator 111s (that are located on the side of the first terminal Port11). For example, when the thickness t1 of the dielectric layer 326 of the serial resonator 111s is about 1,230 nm, the thickness t2 of each of the dielectric layers 326 of the other resonators excluding the serial resonator 111s, which are the resonators 112s to 114s and 111p and 113p, is preferably about 1,430 nm.

As described above, the thickness t1 of the dielectric layer 326 of the serial resonator 111s is set to be smaller than the thickness t2 of each of the dielectric layers 326 of the resonators 112s to 114s and 111p to 113p, so that the occurrence of a higher-mode spurious emission in the serial resonator 111s that significantly affects the second filter 21 is able to be reduced or prevented.

Note that the thickness t1 or t2 of one of the dielectric layers 326 according to the present preferred embodiment is the distance from the main surface of the substrate 320 to the surface of the dielectric layer 326 and includes the thickness of the silicon dioxide film 324. The thicknesses t2 of the dielectric layers 326 of the resonators 112s to 114s and 111p to 113p may be the same or substantially the same as one another or may be different from one another.

Figure 15:
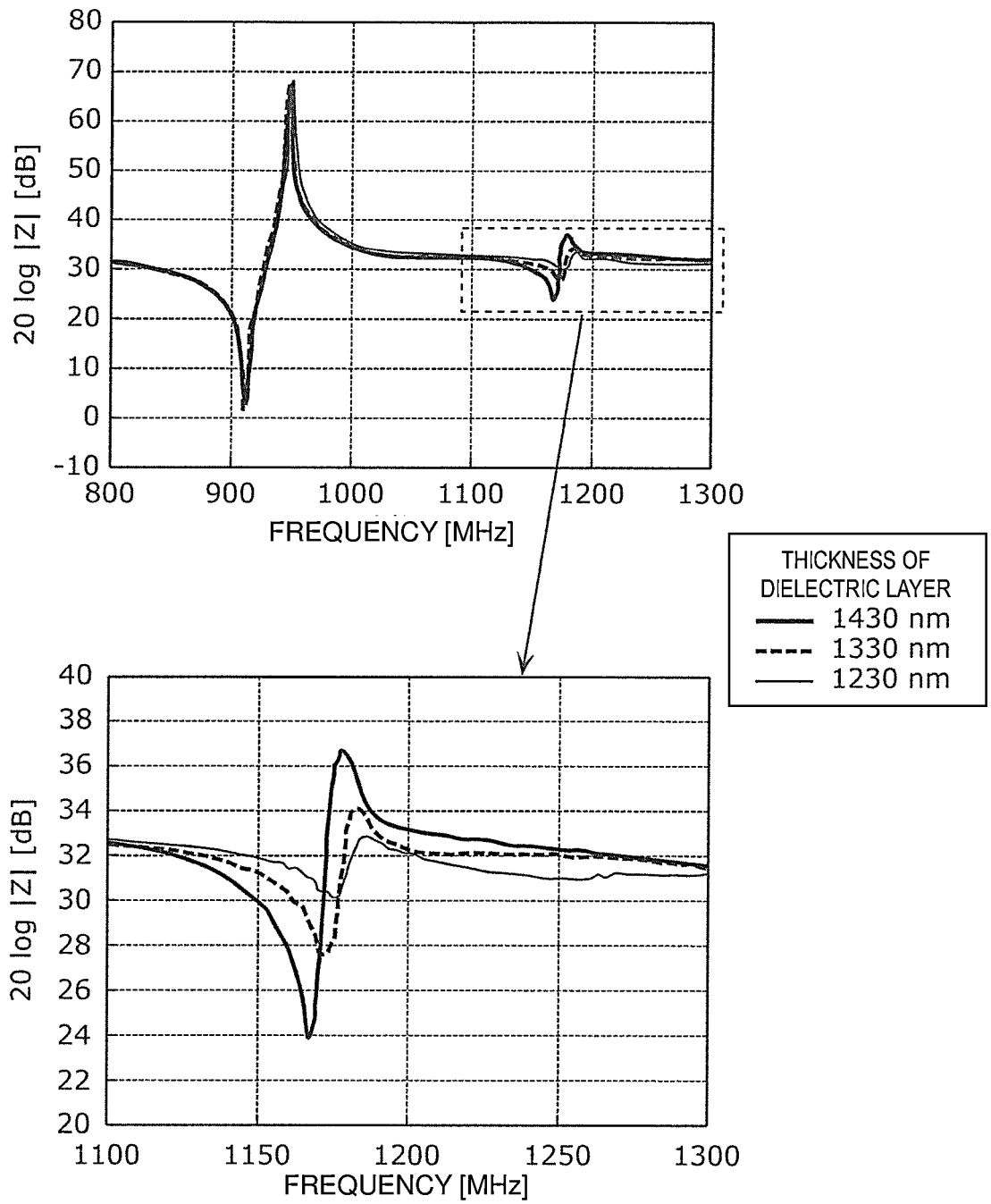
FIG. 15 is a graph illustrating variations in the impedance of the elastic wave resonator according to the third preferred embodiment of the present invention.

FIG. 15 is a graph illustrating variations in the impedance of one of the resonators 110 according to the third preferred embodiment. More specifically, FIG. 15 is a diagram illustrating the relationship between frequency and impedance when the thickness t1 of the dielectric layer of the serial resonator 111s is changed. Note that FIG. 15 illustrates resonance characteristics in a Love mode.

As illustrated in FIG. 15, in the serial resonator 111s, impedance fluctuations occur, and a higher-mode spurious emission appears around a frequency of about 1,170 MHz, which is included in the stop band of the first filter 11. When the impedance fluctuations are observed for each thickness t1 of the dielectric layer 326, the impedance fluctuations are large when the thickness t1 is about 1,430 nm, and as the thickness t1 is reduced, in a stepwise manner, to about 1,330 nm and to about 1,230 nm, the impedance fluctuations become smaller. For example, when the thickness t1 of the dielectric layer 326 is about 1,230 nm, the impedance fluctuations in the stop band of the first filter 11 are small, and the level of the higher-mode spurious emission is decreased.

Figure 16:
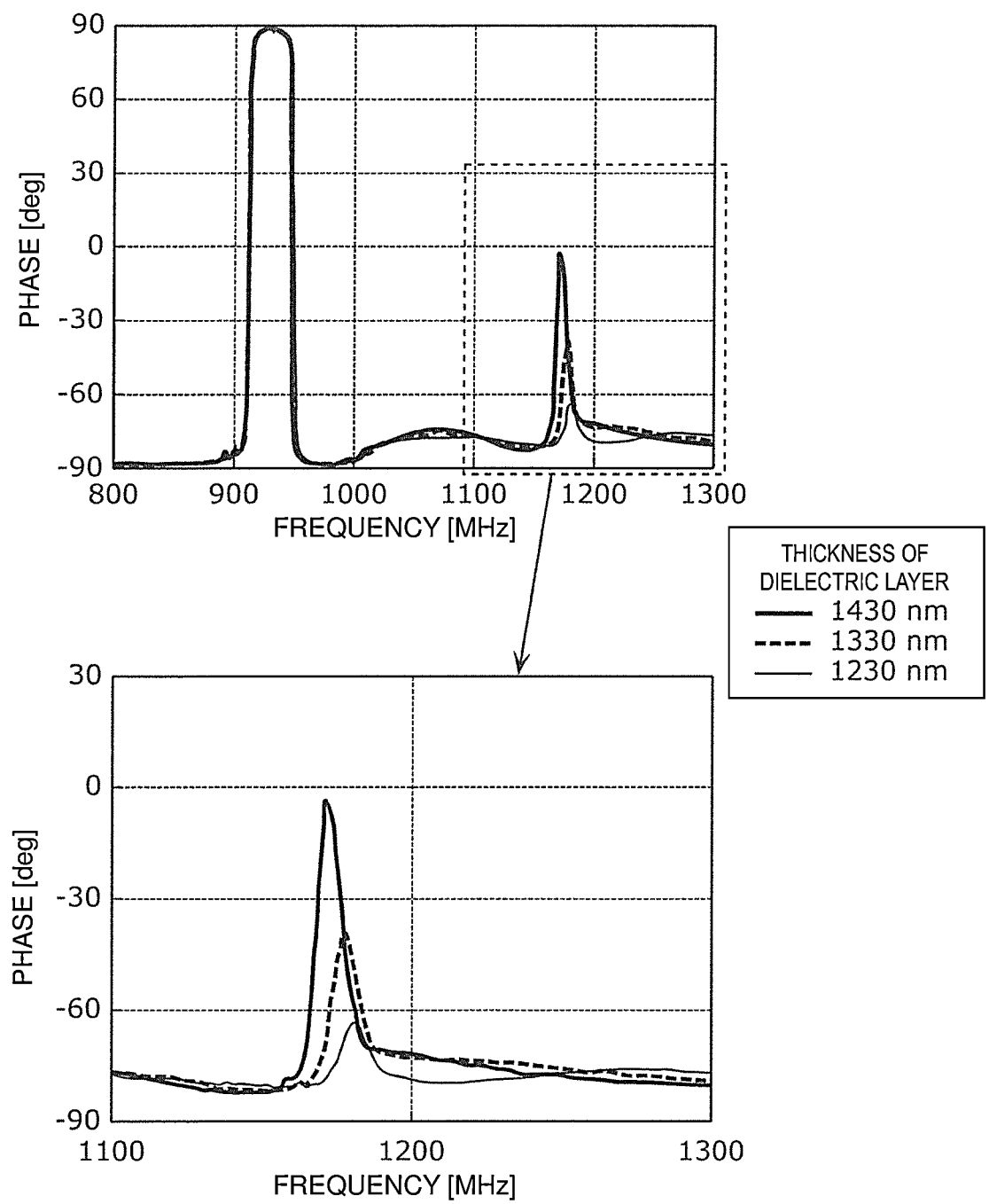
FIG. 16 is a graph illustrating a relationship between frequency and phase of the elastic wave resonator according to the third preferred embodiment of the present invention.

FIG. 16 is a graph illustrating a relationship between frequency and phase of one of the resonators 110 and is a graph illustrating the impedance illustrated in FIG. 15 converted into a phase by using the S-parameters. By converting the impedance into a phase as illustrated in FIG. 16, variations in a higher-mode spurious emission that occur when the thickness t1 of the dielectric layer 326 is notably changed appear as the differences between phases.

As illustrated in FIG. 16, in the serial resonator 111s, the phases are large, and a higher-mode spurious emission appears around a frequency of about 1,170 MHz, which is included in the stop band of the first filter 11. When the phases are observed for each thickness t1 of the dielectric layer 326, the phase is large when the thickness t1 is about 1,430 nm, and as the thickness t1 is reduced in a stepwise manner, the phase becomes smaller. For example, when the thickness t1 of the dielectric layer 326 is about 1,230 nm, the phase in the stop band of the first filter 11 is small, and the level of the higher-mode spurious emission is decreased. In addition, as the thickness t1 is reduced in a stepwise manner, the peak of a mountain shape of the spurious emission shifts to the high-frequency side. For example, in the case in which the pass band of the second filter 21 is located farther toward the low-frequency side than a frequency band in which a higher-mode spurious emission occurs is, the frequency band in which the higher-mode spurious emission occurs is able to be set apart from the pass band of the second filter 21 by reducing the thickness t1.

Figure 17:
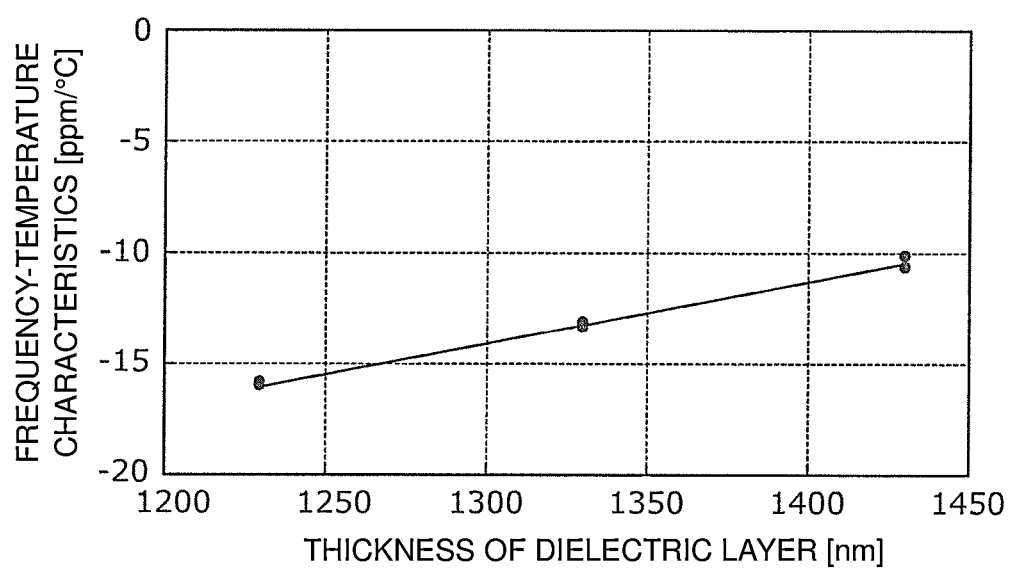
FIG. 17 is a graph illustrating an example of frequency-temperature characteristics of the elastic wave resonator according to the third preferred embodiment of the present invention.

FIG. 17 is a graph illustrating an example of the frequency-temperature characteristics of one of the resonators 110. FIG. 17 illustrates the fact that the frequency-temperature characteristics deteriorate as the dielectric layer 326 becomes thin. For example, it may be considered to reduce the thicknesses of the dielectric layers 326 of all of the resonators 110 included in the first filter 11 in order to reduce the level of a higher-mode spurious emission. In this case, however, the frequency-temperature characteristics deteriorate as illustrated in FIG. 17. In the present preferred embodiment, among the dielectric layers 326 of all of the resonators 110, the dielectric layer 326 of the serial resonator 111s that significantly affects the second filter 21 is made thin, instead of reducing the thicknesses of the dielectric layers 326 of all of the resonators 110. As a result, the occurrence of a higher-mode spurious emission in the first filter 11 is able to be reduced or prevented, and the insertion loss in the pass band of the second filter 21 is able to be reduced or prevented.

Similar to the first preferred embodiment, in the multiplexer 1 according to the third preferred embodiment, the thickness t1 of the dielectric layer 326 of the first serial resonator 111s is smaller than the thickness t2 of each of the dielectric layers 326 of the plurality of elastic wave resonators 112s to 114s and 111p to 113p.

As in the third preferred embodiment, even in the case in which a Love wave is used as an elastic wave and in which the silicon dioxide film 324 is provided between the substrate 320 and the electrode layer 325, the occurrence of a higher-mode spurious emission in the serial resonator 111s is able to be reduced or prevented by setting the thickness t1 to be smaller than the thickness t2. As a result, the occurrence of a higher-mode spurious emission in the first filter 11 is able to be reduced or prevented, and the insertion loss in the pass band of the second filter 21 is able to be reduced or prevented.

Fourth Preferred Embodiment

The multiplexers according to the above-described first, second, and third preferred embodiments and the modifications thereof may be applied to high-frequency front-end circuits and also to communication devices that includes the high-frequency front-end circuits. Accordingly, such a high-frequency front-end circuit and such a communication device will be described in a fourth preferred embodiment of the present invention.

Figure 18:
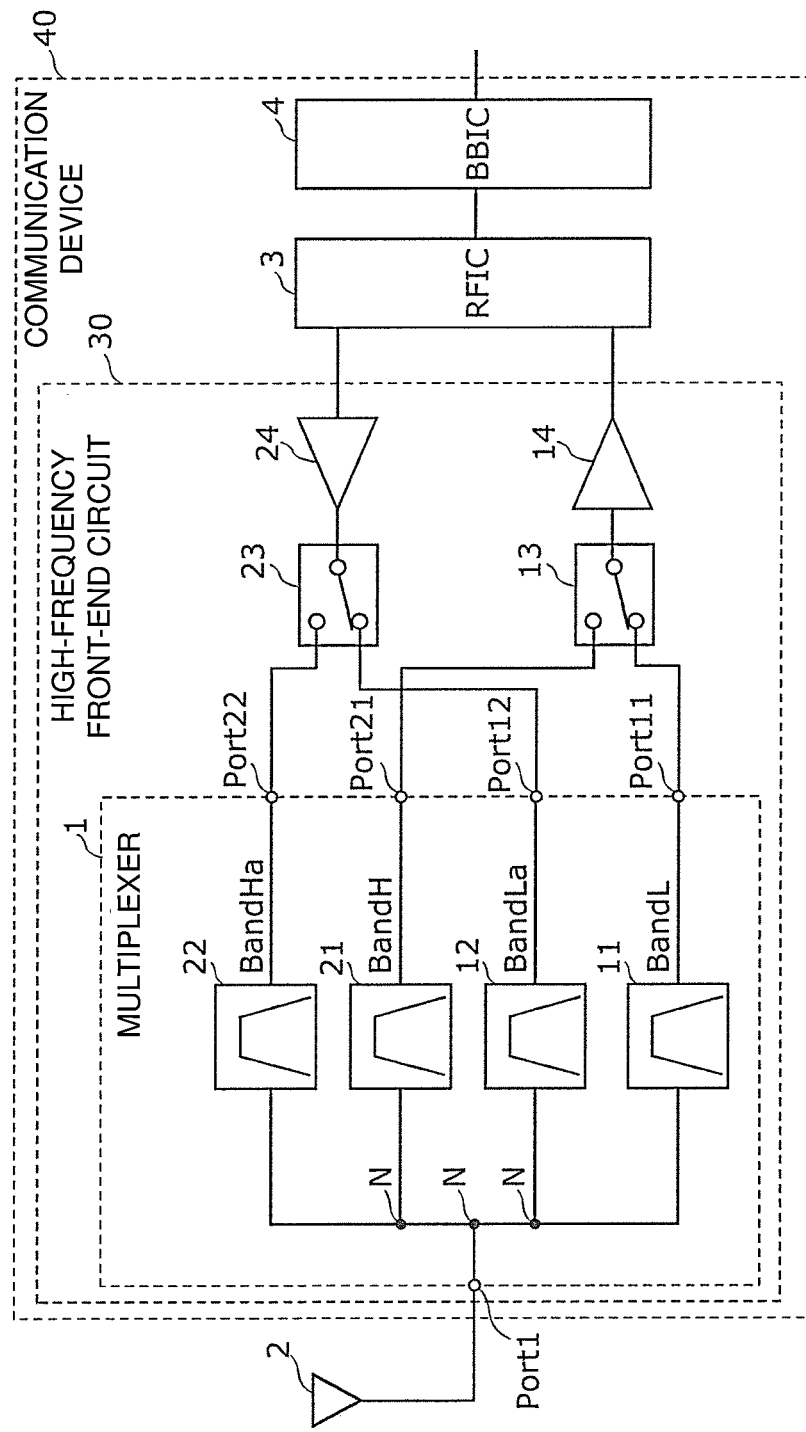
FIG. 18 is a diagram illustrating the configuration of a high-frequency front-end circuit according to a fourth preferred embodiment of the present invention.

FIG. 18 is a diagram illustrating the configuration of a high-frequency front-end circuit 30 according to the fourth preferred embodiment. Note that FIG. 18 also illustrates the antenna element 2, an RF-signal processing circuit (RFIC) 3, and a base-band-signal processing circuit (BBIC) 4 each of which is connected to the high-frequency front-end circuit 30. The high-frequency front-end circuit 30, the RF-signal processing circuit 3, and the base-band-signal processing circuit 4 are included in a communication device 40.

The high-frequency front-end circuit 30 includes the multiplexer 1 according to the first preferred embodiment, a reception switch 13, a transmission switch 23, a low-noise amplifier circuit 14, and a power amplifier circuit 24.

The multiplexer 1 includes four filters. More specifically, the multiplexer 1 includes a filter 12 and a filter 22, in addition to the first filter 11 and the second filter 21. The filter 12 is a transmission filter that uses an upstream frequency band (transmission band) as its pass band and is disposed on a path connecting the common terminal Port1 and an individual terminal Port12 to each other. The filter 22 is a transmission filter that uses the upstream frequency band (transmission band) as its pass band and is disposed on a path connecting the common terminal Port1 and an individual terminal Port22 to each other.

The reception switch 13 is a switch circuit including two selection terminals that are respectively connected to the first terminal Port11 and the second terminal Port21, which are output terminals of the multiplexer 1, and a common terminal that is connected to the low-noise amplifier circuit 14.

The transmission switch 23 is a switch circuit including two selection terminals that are respectively connected to the individual terminal Port12 and the individual terminal Port22, which are input terminals of the multiplexer 1, and a common terminal that is connected to the power amplifier circuit 24.

The reception switch 13 and the transmission switch 23 each connect the corresponding common terminal and a signal path, which corresponds to a predetermined band, to each other in accordance with a control signal from a controller (not illustrated) and is preferably, for example, a single-pole, double-throw (SPDT) switch. Note that the number of selection terminals to be connected to each of the common terminals is not limited to one and may be two or more. In other words, the high-frequency front-end circuit 30 may support carrier aggregation.

The low-noise amplifier circuit 14 is a reception amplifier circuit that amplifies a high-frequency signal (high-frequency reception signal in the present preferred embodiment) that has passed through the antenna element 2, the multiplexer 1, and the reception switch 13 and outputs the high-frequency signal to the RF-signal processing circuit 3.

The power amplifier circuit 24 is a transmission amplifier circuit that amplifies a high-frequency signal (high-frequency transmission signal in the present preferred embodiment) that has been output by the RF-signal processing circuit 3 and outputs the high-frequency signal to the antenna element 2 via the transmission switch 23 and the multiplexer 1.

The RF-signal processing circuit 3 performs signal processing, such as down-conversion, for example, on a high-frequency reception signal that has been input thereto from the antenna element 2 through a reception-signal path and outputs a reception signal generated by the signal processing to the base-band-signal processing circuit 4. In addition, the RF-signal processing circuit 3 performs signal processing, such as up-conversion, for example, on a transmission signal that has been input thereto from the base-band-signal processing circuit 4 and outputs a high-frequency transmission signal generated by the signal processing to the power amplifier circuit 24. The RF-signal processing circuit 3 is, for example, an RFIC.

For example, a signal that has been processed by the base-band-signal processing circuit 4 is used as an image signal for image display or as a voice signal for conversation.

Note that the high-frequency front-end circuit 30 may include other circuit elements between the components described above.

According to the high-frequency front-end circuit 30 and the communication device 40, which are configured as described above, as a result of the multiplexer 1 according to the first preferred embodiment being included in the high-frequency front-end circuit 30 and the communication device 40, the occurrence of a higher-mode spurious emission outside the pass band of the first filter 11 is able to be reduced or prevented, and the insertion loss in the pass band of the second filter 21 is able to be reduced.

Note that the high-frequency front-end circuit 30 may include, for example, instead of the first filter 11 of the multiplexer 1 according to the first preferred embodiment, the first filter 11 according to the first modification of the first preferred embodiment, the first filter 11 according to the second preferred embodiment, the first filter 11A according to the third preferred embodiment, or the first filter 11A according to the first modification of the third preferred embodiment.

In addition, the communication device 40 does not need to include the base-band-signal processing circuit 4 in accordance with a method of processing a high-frequency signal.

Although the multiplexers, the high-frequency front-end circuits, and the communication devices according to the preferred embodiments of the present invention and the modifications thereof have been described above, other preferred embodiments that are obtained by combining components of the above-described preferred embodiments and modifications, modifications that are obtained by making various modifications devised by those skilled in the art within the gist of the present invention to the above-described preferred embodiments, and various devices that include the high-frequency front-end circuits and the communication devices according to preferred embodiments of the present invention built therein are also included in the scope of the present invention.

For example, in the fourth preferred embodiment, although the multiplexer that includes the four filters has been described as an example, the present invention may also be applied to, for example, a triplexer in which an antenna terminal is shared by three filters and a hexaplexer in which an antenna terminal is shared by six filters. In other words, the multiplexer may include at least two or more filters.

In the first preferred embodiment, a case in which both of the first filter and the second filter are reception filters has been described. However, the present invention is not limited to the use of the first and second filters and may have other applications as long as a higher-mode spurious emission that occurs in the first filter is within the pass band of the second filter in the multiplexer. Thus, only one of the first and second filters may be a reception filter. The multiplexer is not limited to having a configuration that includes both of a transmission filter and a reception filter and may have a configuration that includes only transmission filters or only reception filters.

In the first preferred embodiment, although a case has been described in which each of the resonators 110 does not include offset electrode fingers (electrodes each of which faces an electrode finger of one of a pair of comb-shaped electrodes and projects from a busbar electrode of the other comb-shaped electrode), the present invention is not limited to this case, and each of the resonators may include such offset electrode fingers.

The material of the electrode layer 325 of the IDT electrode 32 and the reflectors 32c and the material of the dielectric layer 326 are not limited to the materials described above. In addition, the IDT electrode 32 does not need to have the above-described multilayer structure. For example, the IDT electrode 32 may be made of a metal such as Ti, Al, Cu, Pt, Au, Ag, or Pd, or an alloy and may include a plurality of multilayer bodies made of the above-described metals or alloys.

In the case in which the second filter 21 has a ladder filter structure, the average value of the thicknesses of the dielectric layers of the elastic wave resonators 110 included in the first filter 11 may be set to be smaller than the average value of the thicknesses of the dielectric layers of the elastic wave resonators included in the second filter 21. As a result, the level of higher-mode spurious emission that occurs in the first filter 11 is able to be reduced.

In the first preferred embodiment, although a substrate that has piezoelectricity has been described as the substrate 320, the substrate may be a piezoelectric substrate including a single piezoelectric layer. In this case, the piezoelectric substrate is preferably made of, for example, a piezoelectric single crystal, such as $LiTaO_3$, or a different piezoelectric single crystal, such as $LiNbO_3$. In addition, the substrate 320, on which the IDT electrode 32 is provided, may have a structure in which the entire substrate 320 is made of a piezoelectric layer or may have a structure in which a piezoelectric layer is laminated on a support substrate as long as the substrate 320 has piezoelectricity.

The cut angle of the substrate 320 according to the first preferred embodiment is not limited. In other words, the multilayer structure, the material, and the thickness may be suitably changed in accordance with the required bandpass characteristics of the elastic wave filter, and even in the case of a surface acoustic wave filter using, for example, a $LiTaO_3$ piezoelectric substrate or a $LiNbO_3$ piezoelectric substrate that has a cut angle other than the cut angles described in the first preferred embodiment, similar advantageous effects are able to be obtained.

Preferred embodiments of the present invention may be widely used as a multiplexer, a front-end circuit, and a communication device that are compatible with a multi-band system in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multiplexer comprising:
a common terminal;
a first terminal;
a second terminal;

a first filter disposed on a first path connecting the common terminal and the first terminal to each other and that includes a plurality of elastic wave resonators; and a second filter disposed on a second path connecting the common terminal and the second terminal to each other and that has a pass band higher in frequency than a pass band of the first filter; wherein the plurality of elastic wave resonators include:
    one or more serial resonators that are disposed on the first path; and
    two or more parallel resonators each of which is disposed on a path connecting a node on the first path and a ground to each other;

the two or more parallel resonators include a first parallel resonator located on a side of the common terminal and a parallel resonator located on a side of the first terminal when seen from a first serial resonator that is one of the one or more serial resonators and that is closer to the common terminal than a remainder of the one or more serial resonators;

each of the plurality of elastic wave resonators includes a substrate having piezoelectricity, an interdigital transducer (IDT) electrode including a pair of comb-shaped electrodes that are provided on the substrate, and a dielectric layer provided on the substrate so as to cover the IDT electrode; and the dielectric layer of the first parallel resonator and the dielectric layer of the first serial resonator each have a thickness smaller than a thickness of the dielectric layer or layers of a remainder of the plurality of elastic wave resonators.

2. The multiplexer according to claim 1, wherein each of the dielectric layers is provided such that a surface of the dielectric layer is parallel or substantially parallel to a main surface of the corresponding substrate.

3. The multiplexer according to claim 1, wherein each of the substrates is a lithium niobate substrate.

4. The multiplexer according to claim 1, wherein a frequency at which a higher-mode spurious emission is caused to occur by the first filter is included in a frequency pass band of the second filter.

5. A high-frequency front-end circuit comprising:
the multiplexer according to claim 1; and
an amplifier circuit that is connected to the multiplexer.

6. The high-frequency front-end circuit according to claim 5, wherein each of the dielectric layers is provided such that a surface of the dielectric layer is parallel or substantially parallel to a main surface of the corresponding substrate.

7. The high-frequency front-end circuit according to claim 5, wherein a frequency at which a higher-mode spurious emission is caused to occur by the first filter is included in a frequency pass band of the second filter.

8. A communication device comprising:
an RF-signal processing circuit that processes a high-frequency signal that is transmitted and received by an antenna element; and
the high-frequency front-end circuit according to claim 5 that transmits the high-frequency signal between the antenna element and the RF-signal processing circuit.

* * * * *